United States Patent
Shimoyama et al.

(10) Patent No.: US 7,605,057 B2
(45) Date of Patent: Oct. 20, 2009

(54) SEMICONDUCTOR DEVICE AND MANUFACTURING METHOD THEREOF

(75) Inventors: Akio Shimoyama, Fukuyama (JP); Hajime Oda, Okayama (JP); Keiichi Sawai, Fukuyama (JP); Takayuki Taniguchi, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/822,427

(22) Filed: Jul. 5, 2007

(65) Prior Publication Data
US 2008/0032485 A1    Feb. 7, 2008

(30) Foreign Application Priority Data
Jul. 5, 2006    (JP)    ............... 2006-186053

(51) Int. Cl.
  *H01L 21/00*    (2006.01)
(52) U.S. Cl. ............... 438/460; 438/461; 438/462; 438/463; 438/464
(58) Field of Classification Search ............... 438/401, 438/460–464, 110, 113; 257/E21.503, 505, 257/599, E23.064, 95, 127, 179
See application file for complete search history.

(56) References Cited

U.S. PATENT DOCUMENTS

| | | | | |
|---|---|---|---|---|
| 5,552,345 | A * | 9/1996 | Schrantz et al. | ............. 438/460 |
| 6,303,471 | B1 * | 10/2001 | Unno et al. | ................. 438/464 |
| 7,101,620 | B1 * | 9/2006 | Poddar et al. | ............... 428/354 |
| 7,435,664 | B2 * | 10/2008 | Lu et al. | ..................... 438/460 |
| 2006/0024920 | A1 * | 2/2006 | Goto et al. | .................. 438/460 |

FOREIGN PATENT DOCUMENTS

| | | | |
|---|---|---|---|
| JP | 11-67699 A | | 3/1999 |
| JP | 2006-114672 A | | 4/2006 |
| JP | 2006-114672 A | * | 4/2006 |
| JP | 2006114672 A | * | 4/2006 |

* cited by examiner

*Primary Examiner*—Thao X Le
*Assistant Examiner*—Eric W Jones
(74) *Attorney, Agent, or Firm*—Nixon & Vanderhye, PC

(57) ABSTRACT

A method of manufacturing a semiconductor device can suppress the generation of burrs when an array of integrated circuits to which a supporting member is bonded for assistance is separated into chips. The supporting member having thinned regions (or void regions which are openings in the supporting member) located correspondingly beneath the scribing lines extending between the integrated circuits is bonded by an adhesive to the back side of a semiconductor substrate on which integrated circuits are arrayed at the primary side. Then, a dicing tape is attached to the support member to secure the entire assembly, and the assembly of the integrated circuits, the semiconductor substrate, the adhesive, and the supporting member are cut along the scribing lines, and then the dicing tape is removed.

12 Claims, 19 Drawing Sheets

13 (Entire Assembly)

14 (Thinned Region)

14 (Thinned Region)
10
11
13

14b (Thinned Region)

14a (Void Region)

13 (Entire Assembly)

10

14 (Thinned Region)

11

13 (Entire Assembly)

14 (Void Region)

SEMICONDUCTOR DEVICE AND MANUFACTURING METHOD THEREOF

CROSS REFERENCE TO RELATED APPLICATION

This Nonprovisional application claims priority under 35 U.S.C. §119(a) on Patent Application No. 2006-186053 filed in Japan on 5 Jul. 2006 the entire contents of which are hereby incorporated by reference.

BACKGROUND OF THE INVENTION

1. Field of the Invention

The present disclosure relates to a semiconductor device and a method of manufacturing the same and particularly to a semiconductor device and a method of manufacturing the same where the integrated circuit chip is bonded at its back side with a support member.

2. Description of the Related Art

Recently, as electronic appliances have been reduced in the overall dimensions, their mounted semiconductor devices are demanded to be increased in the mount concentration and minimized in the thickness and favorably marketed in the form of so-called surface mount type packages. For the surface mounting with LSI devices, a technique is known as ball grid array (BGA) where an array of spherical solder drops termed solder bumps which serve as external connector terminals are disposed two-dimensionally on one side of the package. Another technique of chip size package (CSP) is known where the package carrying a BGA arrangement is minimized to a size substantially equal to the size of a semiconductor chip for implementing the structure at extremely higher density and smaller thickness.

Some of the CSP techniques employ a flexible, electrically insulating substrate made from a polyimide resin material or the like and arranged on one side of which a BGA arrangement of solder bumps are disposed two-dimensionally. More specifically, a CSP type semiconductor device is provided having a semiconductor chip fixedly bonded to a flexible insulating substrate by an adhesive layer of an electrically non-conductive epoxy resin material known as Dia-touch material, connected with wirings, and encapsulated in a protective resin. Then, the BGA type semiconductor device is mounted on an external substrate (a printed circuit board) using a mounter and its solder bumps are fused by a batch reflow technique.

It is essential for mounting the semiconductor device to improve the packaging reliability. Generally speaking, the BGA package is lower in the reliability than a QFP (quad flat package) device. It is known that the CPS type semiconductor device often exhibits a crack in the joint between the external substrate and the solder bump when subjected to a thermal cycle test, resulting in open failure. It may be caused by the shear force which is produced by the effect of a difference in the linear expansion coefficient between the semiconductor chip and the external substrate and intensified at the joint. That is, as the elasticity of the flexible insulating substrate and the Dia-touch material disposed between the semiconductor chip and the external substrate is significantly lower than that of the semiconductor chip or the external substrate, the shear force will be generated by the effect of a difference in the linear expansion coefficient between the two and intensified at the joint of the soldering.

Such electronic appliances are commonly carried by users for use. Hence, the electronic appliance may be threatened by a mechanical stress such as deflection or twist due to mishandling during the transportation or the operation. This will result in injury or breakage of the integrated circuit chip, thus declining the function of the electronic appliance.

For avoiding the above drawback, the integrated circuit chip is assisted by a supporting member. In a known manner, each integrated circuit chip after separation is bonded with the supporting member which has been sized equal to the chip. The known manner will however increase the processing time, the number of manufacturing steps, and the overall cost. For compensation, some methods have been developed where the supporting member is bonded to the back side of a semiconductor substrate and then the both are subjected to a dicing process at once or separately (as disclosed in Japanese Patent Laid-open Publications No. 2000-124162 and No. (Heisei) 11-67699).

However, even when the method disclosed in No. 2000-124162 states that its resultant integrated circuit chip assisted with the supporting member made of a metallic material is free from the generation of burrs after the dicing process using a CBN blade, the dicing starting from the primary side of the semiconductor substrate (on which the integrated circuits are arrayed) may produce burrs ranging from 10 µm to 100 µm at the lower side of the supporting member. Also, the dicing starting from the back side (the reinforcement side) may produce burrs of 10 µm to 100 µm at the upper side of the supporting member extending towards the semiconductor substrate. The method disclosed in No. (Heisei)11-67699 states that the dicing of the supporting member made of a metallic material is carried out using a dual dicer but fails to eliminate the generation of burrs ranging from 10 µm to 100 µm which appear at the lower side of the supporting member when the dicing starts from the primary side similar to that of the previous method of No. 2000-124162. Such burrs result in the handling error or the mounting error of the integrated circuit chip, hence interrupting the productivity at stableness.

SUMMARY OF THE TECHNOLOGY

The present technology has been developed in view of the above aspects to provide a method of manufacturing a semiconductor device where an array of the integrated circuits bonded by the supporting member for reinforcement can be separated into chips while suppressing the generation of burrs. The methods also minimize the generation of burrs during the semiconductor device manufacturing process.

The semiconductor device manufacturing methods disclosed herein include a step of cutting a semiconductor substrate on the primary side of which a plurality of integrated circuits are arrayed, along the scribing lines extending lengthwise and widthwise on the semiconductor substrate to separate the integrated circuits into integrated circuit chips, the step of bonding the supporting member to the back side of the semiconductor substrate which is opposite to the primary side and cutting at least either the supporting member or the semiconductor substrate along the scribing lines to separate the semiconductor substrate into a plurality of supported integrated circuit chips which are supported at its back side, wherein the supporting member has a supporting block region located beneath each of the integrated circuit chips on the semiconductor substrate, and at least either a thinned region which is thinner than a supporting block region or a void region which is an opening in the supporting member in at least a part of the outer peripheral region, which is located beneath the scribing lines, of the supporting block region.

If the supporting member is cut at one step in the manufacturing process, when the support member is cut along cutting lines located beneath the scribing lines on the semiconductor substrate, the supporting member formed on the cutting lines has the void regions or the thinned regions which are thinner than the other regions (the supporting block regions), so that the force required for cutting the supporting members can be smaller than that for cutting a supporting member which has the same thickness as the regions other than the cutting lines. Simultaneously, the area at the cross section to be cut of the supporting member can be decreased. This minimizes the generation of burrs. As the result, the semiconductor device manufactured by the disclosed semiconductor device manufacturing method can improve the yield of the surface mounting process.

The semiconductor device manufactured by the above method has the supporting member bonded to the back side of the integrated circuit chip. When the semiconductor device is used in a mobile or portable appliance such as a small electronic appliance, it can be prevented from being injured or broken at its integrated circuit.

The supporting member may preferably be made from an Fe—Ni alloy or a stainless alloy material.

The semiconductor device manufacturing method described above may be modified to include a second feature by comprising a first step of forming the plurality of the integrated circuits on the primary side of the semiconductor substrate, a second step of, after the first step, bonding the supporting member having the thinned region or the void region, to the back side of the semiconductor substrate, a third step of, after the second step, cutting both the semiconductor substrate and the supporting member at once along the scribing lines to form the plurality of supported integrated circuit chips.

According to this method, the number of the steps can be decreased by cutting both the integrated circuits and the supporting member at once while the generation of burrs at the cutting area at the cross section of the supporting member is minimized.

The methods described above may be modified to include a third feature by further comprising a fourth step of attaching a dicing tape to the back side of the supporting member to secure the semiconductor substrate and the supporting member after the second step and before the third step, the third step being a step for cutting both the semiconductor substrate and the supporting member at once along the scribing lines from the primary side without cutting the dicing tape, and another step of, after the cutting step, removing each of the supported integrated circuit chips from the dicing tape.

According to this method, which includes the third feature, the integrated circuit chips or the supporting members separated after the cutting step can be prevented from dropping off.

The semiconductor device manufacturing may further include a step of forming the plurality of the integrated circuits on the primary side of the semiconductor substrate, a second step of, after the first step, attaching a dicing tape to the primary side of the semiconductor substrate to secure the semiconductor substrate, a third step of, after the second step, cutting the semiconductor substrate from its back side along the scribing lines to form the integrated circuit chips, a fourth step of, after the third step, bonding the supporting member having the thinned region or the void region to the back side of the semiconductor substrate, and a fifth step of, after the fourth step, cutting the supporting member from its back side along the scribing lines to form the supported integrated circuit chips and then removing the supported integrated circuit chips from the dicing tape.

According to this method, which includes a fourth feature, the order of the steps is different from methods that include the second or third features, thus improving the suppression of the generation of burrs as compared with the action of cutting the conventional supporting member.

A semiconductor device manufacturing method including any of the first to fourth features may be modified to include a fifth feature in which the supporting member has the void region or thinned region at each corner of the outer peripheral region of the supporting block region.

A semiconductor device manufacturing method including any of the first to fifth features may be modified to include a sixth feature in which the supporting member has the void region or the thinned region at any other area than each corner of the outer peripheral region of the supporting block region.

A semiconductor device manufacturing method including any of the first to fourth features may be modified to include a seventh feature in which the supporting member has the thinned region at all the outer peripheral region of the supporting block region.

In a semiconductor device manufacturing method including any of the fifth to seventh features, each of the integrated circuit chips after the cutting step is bonded entirely at the back side with the corresponding supporting member, thus ensuring the same supported effect as of the conventionally arranged chips and also minimizing the generation of burrs as compared with the conventionally arranged chips.

A semiconductor device manufacturing method as described above may be provided with an eighth feature in addition to the first feature, comprising a first step of attaching a dicing tape for securing the supporting member to the back side of a plate material which will become the support member and on which neither the thinned region nor the void region has been formed, a second step of, after the first step, etching a part of the plate material to develop the void region at all the outer peripheral region of the supporting block region to form the support member, a third step of, after the second step, bonding the primary side of the supporting member to the back side of the semiconductor substrate on the primary side of which the integrated circuits are arrayed, and a fourth step, after the third step, of cutting the semiconductor substrate along the scribing lines to form the supported integrated circuit chips and removing the supported integrated circuit chips from the dicing tape.

According to the semiconductor device manufacturing method described above, the plate material which becomes the supporting member is secured with the dicing tape and cut by etching into the supporting block regions on which the corresponding integrated circuit chips will be disposed. As the supporting member is bonded to the back side of each semiconductor substrate carrying the integrated circuit, the step of cutting the supporting member by blade or the like can be eliminated, hence minimizing the generation of burrs.

A semiconductor device may be manufactured by a semiconductor device manufacturing method including any of the first to eighth features.

Using the methods described above, generation of burrs in the manufacturing step can be minimized. The semiconductor device may be constructed with one form of the supporting member having substantially uniform thickness bonded entirely to the back side of the integrated circuit chip, another form of the supporting member bonded to the back side at each corner of the integrated circuit chip, arranged thinner than the other regions, a further form of the supporting member bonded to the back side at other than each corner of the integrated circuit chip, a further form of the supporting member bonded to the peripheral region of the back side of the integrated circuit chip, arranged thinner than the other region (bonded to substantially the center area of the back side of the integrated circuit chip), a further form of the supporting member bonded to not at the peripheral region but the other area (substantially the center area) of the back side of the integrated circuit chip, a further form of the supporting member bonded to substantially the center of each side of the peripheral region of the back side of the integrated circuit chip, arranged thinner than the other region, a further form of the supporting member bonded to not substantially the center of each side of the peripheral region but the other area of the back side of the integrated circuit chip, or any other applicable form of the supporting member. Also, the thinned regions or the void regions of the supporting member may be arranged of any shape such as a rectangular, an L shape, a polygonal, a circular arcuate, or an oval arcuate.

Using the semiconductor device manufacturing methods described above, even if the supporting member is cut at one step in the manufacturing process, when the support member is cut along cutting lines located beneath the scribing lines on the semiconductor substrate, the supporting member formed on the cutting lines has the void regions or the thinned regions which are thinner than the other regions (the supporting block regions), so that the force required for cutting the supporting members can be smaller than that for cutting along the cutting lines of a supporting member which has the same thickness as the regions other than the cutting line. Simultaneously, the area at the cross section to be cut of the supporting member can be decreased. This minimizes the generation of burrs as compared with the action of cutting the conventional supporting member. As the result, the semiconductor device manufactured by these methods can be improved in the yield of the surface mounting process. In addition, these methods minimize the generation of burrs during the manufacturing process.

DETAILED DESCRIPTION OF THE INVENTION

A semiconductor device and a method of manufacturing the same will be described in the form of embodiments, referring to the relevant drawings.

First Embodiment

The first embodiment (referred to as "this embodiment" for ease of the description) will now be described referring to FIGS. 1 to 13. FIG. 1 is a schematic cross sectional view of steps, FIG. 1A to FIG. 1E, for manufacturing a semiconductor device of this embodiment. FIG. 2 is a flowchart showing the steps of FIG. 1 and the following description will be made using the steps numbered in FIG. 2.

The schematic cross sectional view of FIG. 1 as well as the other schematic cross sectional views for explaining the second and third embodiments are simply illustrative but not scaled nor sized to actual measurements.

Figure 1A:
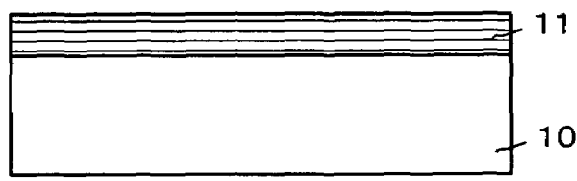
FIG. 1 is a schematic cross sectional view showing the steps of a semiconductor device manufacturing method of the first embodiment of the present invention.
Figure 2:
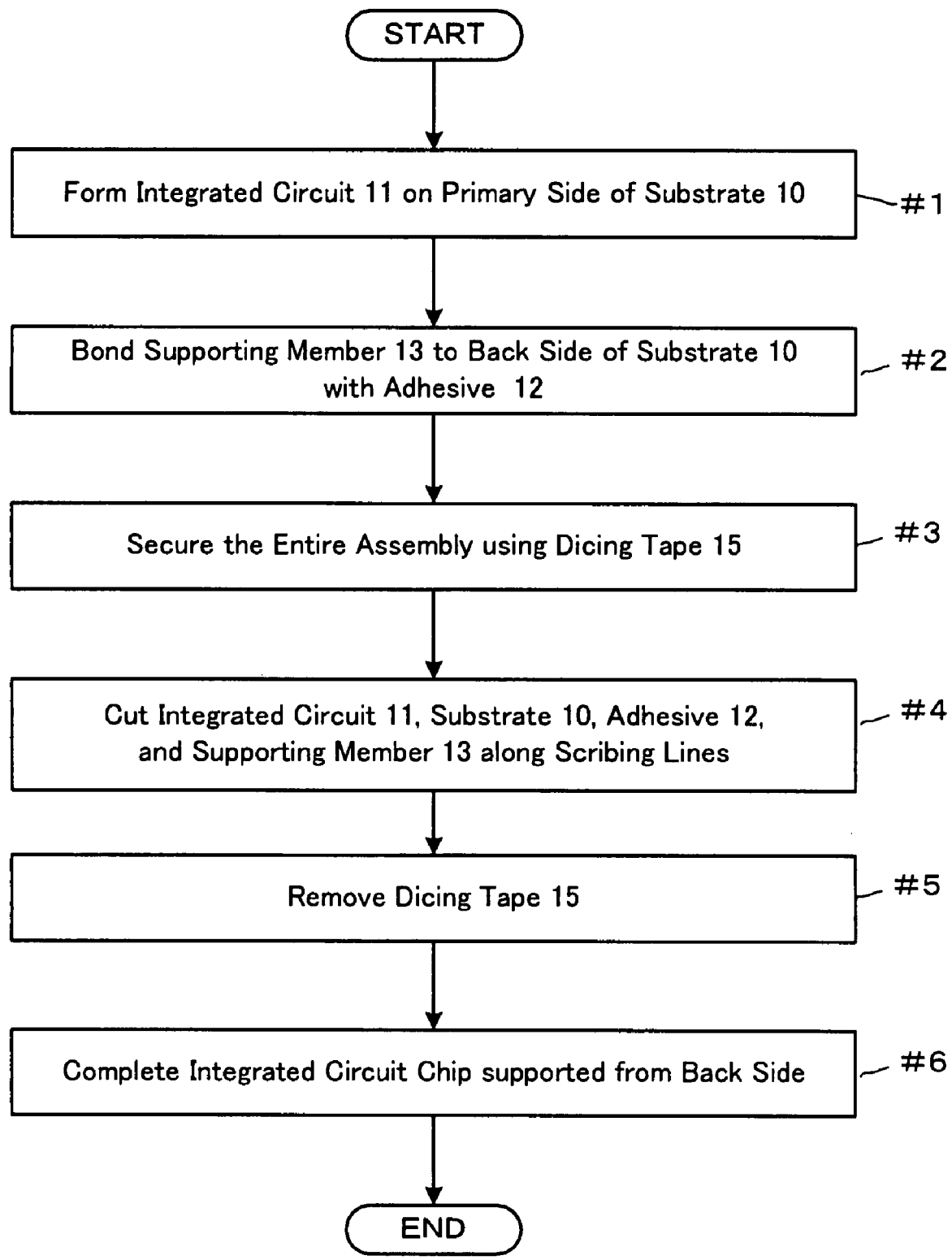
FIG. 2 is a flowchart showing the steps of the semiconductor device manufacturing method of the first embodiment.

As shown in FIG. 1A, the flowchart starts with providing two or more integrated circuits 11 on the primary side of a semiconductor substrate 10 made of a silicon material or the like (Step #1). Then, the semiconductor substrate 10 is thinned by, for example, polishing its back side (not shown). It is desirable in the step of thinning to protect the primary side of the integrated circuit 10 with protective tapes temporarily attached for permitting no injury of the integrated circuits 10.

Figure 1B:
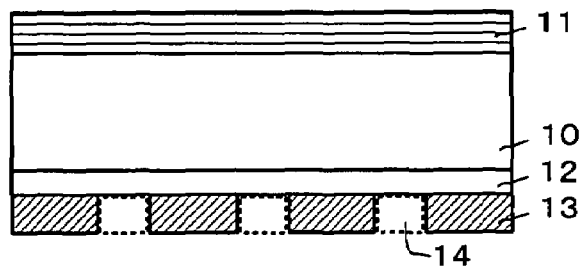

This is followed by, as shown in FIG. 1B, bonding a supporting member 13 by a coat of adhesive 12, such as a die attach film (DAF), to the back side of the thinned semiconductor substrate 10 (Step #2). The supporting member 13 may be a metal plate such as Fe—Ni alloy or stainless alloy. The supporting member 13 is preferably 100 μm in the thickness and may arbitrarily be determined depending on the requirement of the surface mount arrangement.

The supporting member 13 has either its thinned regions which are reduced in the thickness or its void regions which are open between both sides thus having no thickness, the regions being positioned just beneath the scribing lines between the integrated circuits 11. The thickness of the thinned regions may arbitrarily be determined depending on the final design pattern arrangement. In this embodiment, the thickness of the thinned regions is from ½ to ⅕ of the thickness of the supporting member. It is assumed that the thinned region or void region of the supporting member 13 is each denoted by the thinned region 14 or void region 14, when the supporting member 13 has either the thinned region or the void region. When both the thinned region and the void region are provided at once in the supporting member 13, they are denoted by 14a and 14b respectively for ease of the understanding without confusion.

Figure 3A:
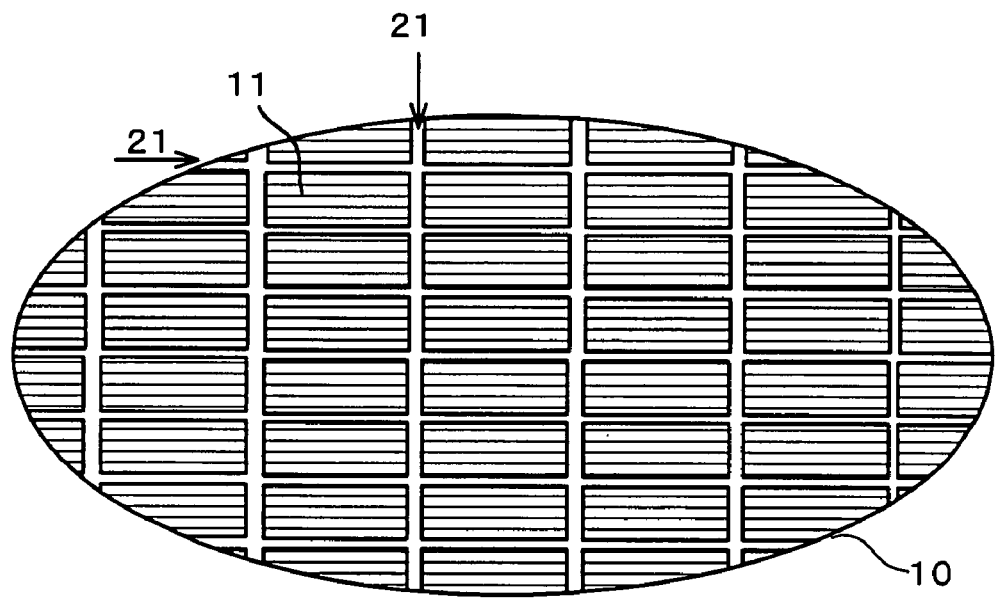
FIG. 3 illustrates a design pattern of a reinforcement or supporting member.
Figure 3B:
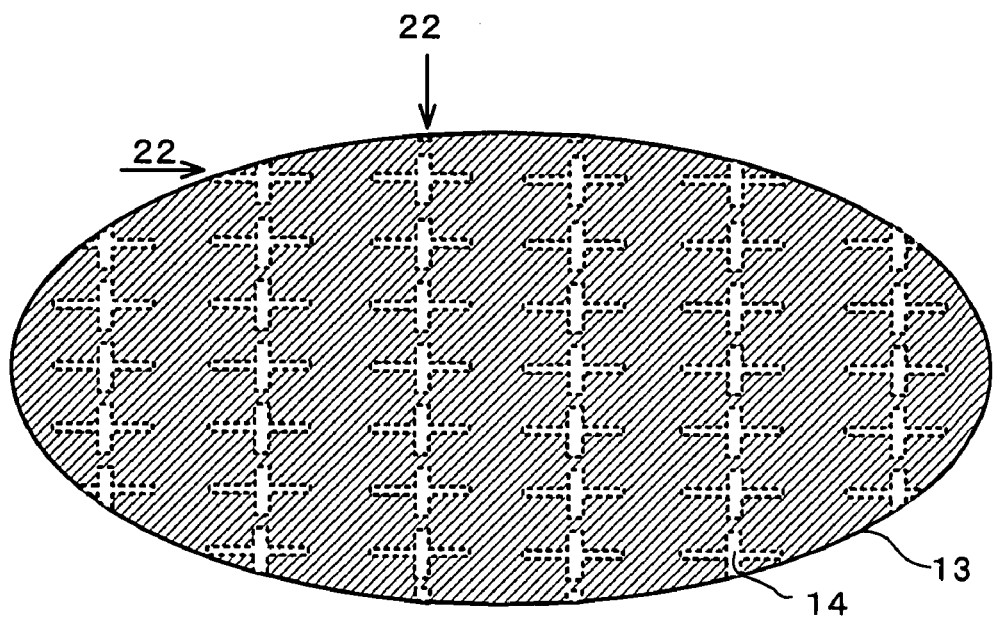

FIG. 3 is diagrams illustrating a design pattern of the supporting member 13 along with the primary side of the semiconductor substrate 10 on which the integrated circuits 11 are arrayed. More particularly, FIG. 3A is a schematic illustrates an array of the integrated circuits 11 provided on the semiconductor substrate 10 at perspective elevation while FIG. 3B illustrates the supporting member 13 corresponding to the array at perspective elevation.

As shown in FIG. 3A, the scribing lines 21 extend lengthwise and widthwise to separate the integrated circuits 11 provided on the primary side of the semiconductor substrate 10. Either the thinned regions or void regions 14 of the supporting member 13 extend partially or entirely beneath the scribing lines 21 on the primary side of the substrate 10. It is also assumed that a region of the supporting member 13 just beneath each integrated circuit chip on the semiconductor substrate 10 defined by the scribing lines 21 is termed "supporting block region" and the other regions (including the void regions) than the supporting block regions which are thinner than the supporting block regions are termed "regions to be thinned". In other words, the supporting member 13 has the thinned regions 14 which are thinner than the supporting block regions or the void regions 14 which is an opening in the supporting member at least in a part of the regions 22 (the outer peripheral region of the supporting block regions) which is located correspondingly beneath the scribing lines 21 on the primary side of the substrate 10. In the supporting member 13 shown in FIG. 3B, the thinned region or void region 14 is assigned to each corner of the outer peripheral region of the supporting block regions.

Figure 4A:
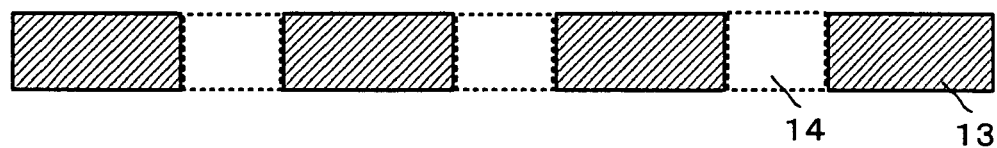
FIG. 4 is a schematic cross sectional view showing regions to be thinned of the supporting member.
Figure 4B:
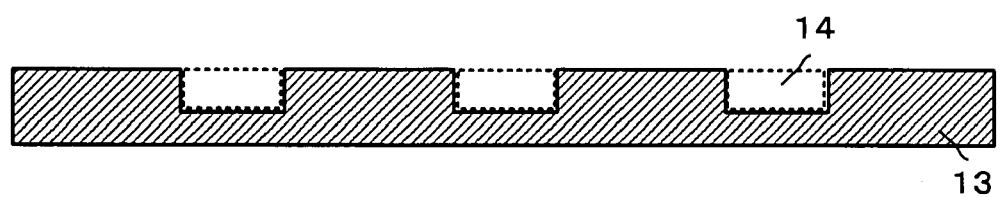
Figure 4C:
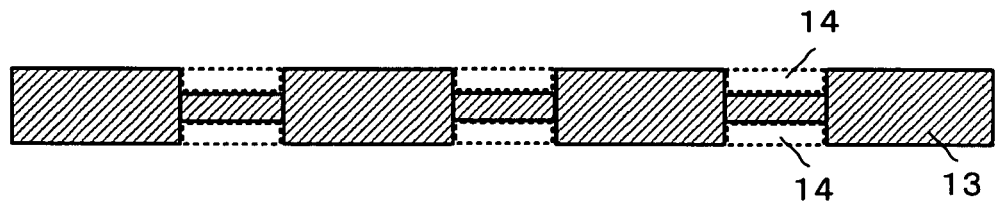

FIG. 4 illustrates schematic cross sectional views of the supporting member 13 including the regions to be thinned. FIG. 4A shows that the regions to be thinned in the supporting member are clear. FIG. 4B shows that the regions to be thinned are formed by providing a recess in one side of the supporting member and being thinner than the supporting block regions. FIG. 4C shows that the regions to be thinned are formed by providing a pair of recesses in both the sides of the supporting member respectively and being thinner than the supporting block regions. The supporting member 13 may be implemented by selecting one of the structures of the regions to be thinned shown in FIGS. 4A to 4C.

At Step #2, the supporting member 13 is bonded to the back side of the semiconductor substrate 10. Preferably, when the supporting member 13 is configured as shown in FIG. 4B, its recessed side (at the upper in the FIG. 4B) is joined to the back side of the semiconductor substrate 10. Alternatively, the other side may be bonded to the back side.

Figure 1C:
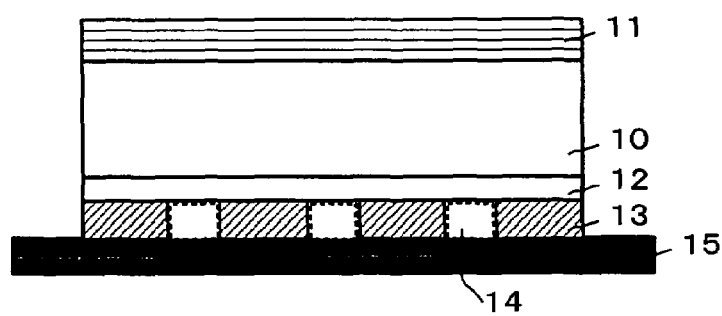

Then, as shown in FIG. 1C, a dicing tape 15 (or a dicing sheet, the dicing tape used for the description hereinafter) is attached to the back side of the supporting member 13 to secure the entire assembly at stableness (Step #3).

Figure 1D:
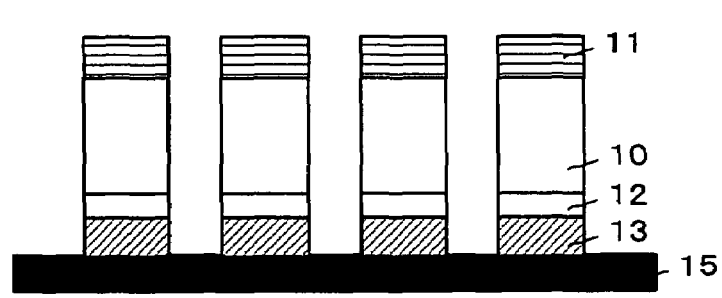

As shown in FIG. 1D, the assembly including the integrated circuits 11, the semiconductor substrate 10, the DAF 12, and the supporting member 13 is cut (diced) continuously along the scribing lines between the integrated circuits 11. The dicing may be conducted at once or in steps. Since the supporting member 13 in this embodiment is made from an Fe—Ni alloy, it is cut using a CBN (cubic boron nitride) blade.

Figure 1E:
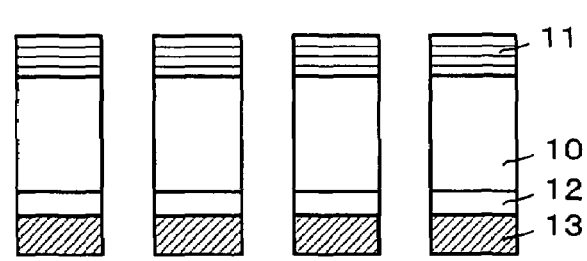
Figure 1E:

As shown in FIG. 1E, the dicing tape 15 is removed from the back side of the supporting member 13 on each integrated circuit chip (Step #6). As the result, the integrated circuit chip remains supported at the back side with the supporting member 13 (Step #6).

Figure 5A:
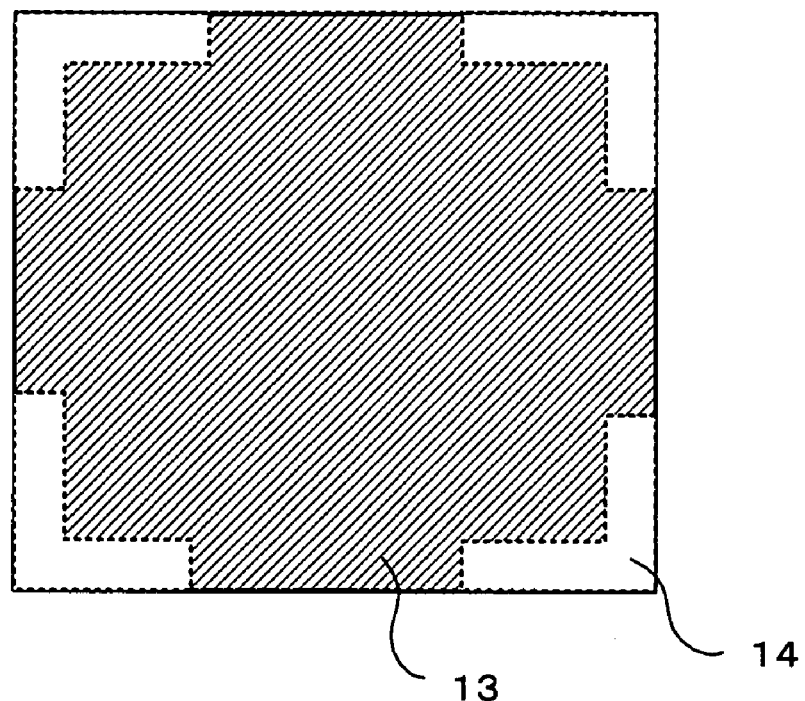
FIG. 5 illustrates schematic views of an integrated circuit chip with the supporting member of the pattern, shown in FIG. 3, manufactured by the semiconductor device manufacturing method of the first embodiment.
Figure 5B:
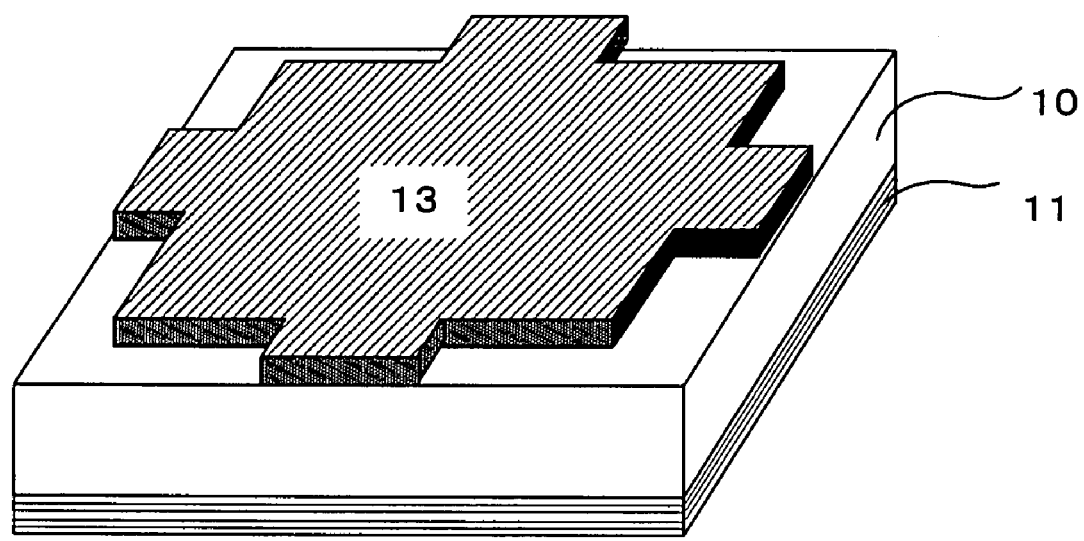
Figure 6A:
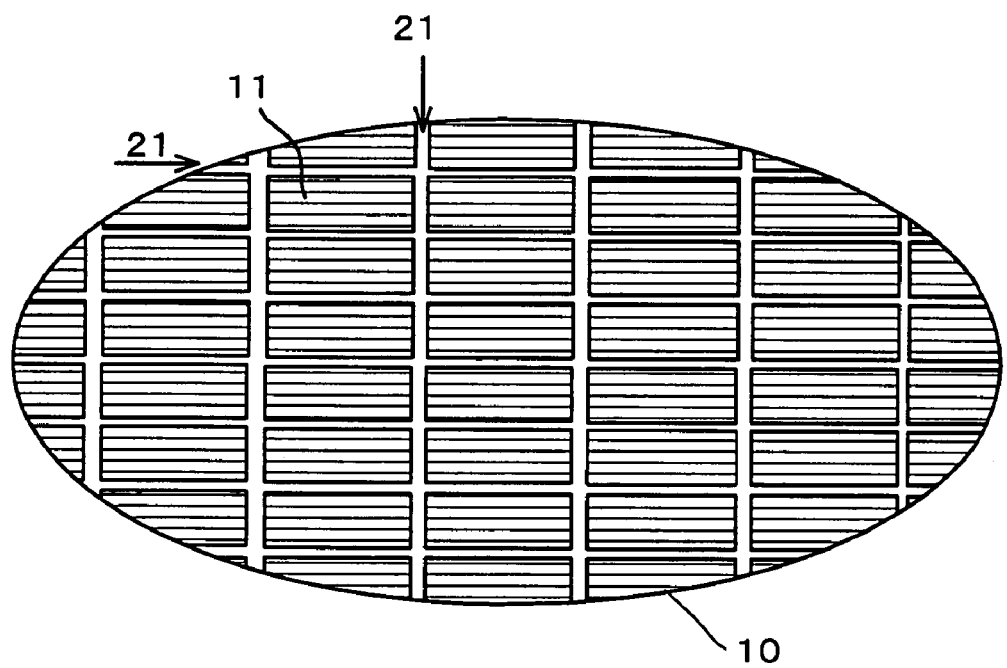
FIG. 6 illustrates another design pattern of the supporting member.

FIG. 5 illustrates schematic views of the integrated circuit chip manufactured by the foregoing steps. FIG. 6A is a schematic top view while FIG. 5B is a schematic perspective view. The chip shown in FIG. 5 is featured with the regions to be thinned remaining open.

FIG. 5 illustrates the integrated circuit chip separated with no cutting margin in an ideal dicing action at Step #4 for ease of the understanding. In actual practice, there are some cutting margins and the four sides of the integrated circuit chip are apparently moved inward by the cutting margins. As will be understood, illustrations shown in FIGS. 7, 9, 11, 13, and 19, described later, result from the ideal dicing action.

As shown in FIG. 3B, each supporting block region in the supporting member 13 in this embodiment is defined at every corners by the void regions. Accordingly, as shown in FIG. 5, the supporting member 13 is not present at each corner of the integrated circuit chip. Hence, the supporting member 13 is smaller in the area size than the semiconductor substrate 10 as there is a discrepancy in the shape at each corner between the supporting member 13 and the semiconductor substrate 10.

As its back side has been joined directly with the semiconductor supporting member 13, the integrated circuit chip is subjected to a known flip chip technique for the surface mounting. After the post steps including an inspection step, the semiconductor device will be finished.

According to the inventive method, at the cutting step of Step #4, since the particular regions of the supporting member 13 including the cutting lines are included at least partly in the regions to be thinned, they remain open as voids or their thickness is smaller than that of the supporting block regions. Therefore, the force required for cutting the supporting member can be lower than that for cutting a supporting member with the conventional thickness. Also, as the supporting member to be cut apart is minimized in the area at the cross section subjected to the cutting, it can create a less amount of the burrs than the conventional supporting member.

The supporting member 13 is not limited to the design pattern shown in FIG. 3B but may be provided with any applicable pattern. Other applicable design patterns of the supporting member 13 will be explained referring to FIGS. 6 to 13.

FIGS. 6, 8, 10, and 12 are views illustrating the other applicable design patterns of the supporting member 13 in combination with the semiconductor substrate 10 on the primary side of which an array of the integral circuits 11 are arrayed as similar to that shown in FIG. 3 for ease of the description. (Equal to FIG. 3, denoted by A is a schematic view at perspective elevation of the semiconductor substrate 10 on the primary side of which the integral circuits 11 are arrayed and denoted by B is a schematic view at perspective elevation of the supporting member 13.)

Figure 6B:
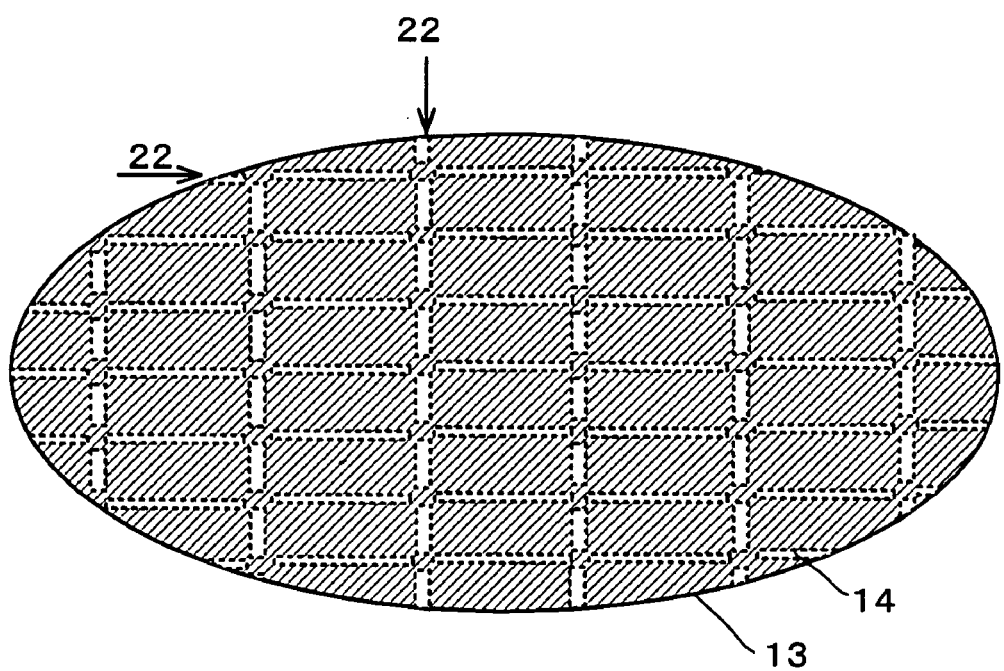

A supporting member 13 shown in FIG. 6B is different in the design pattern from that shown in FIG. 3B, in which the thinned or void regions 14 are provided at a part of the outer peripheral region of the supporting block region excluding the corner regions. FIG. 7 illustrates schematic views of an integrated circuit chip manufactured using the supporting member 13 of this design pattern by the foregoing steps.

Figure 7A:
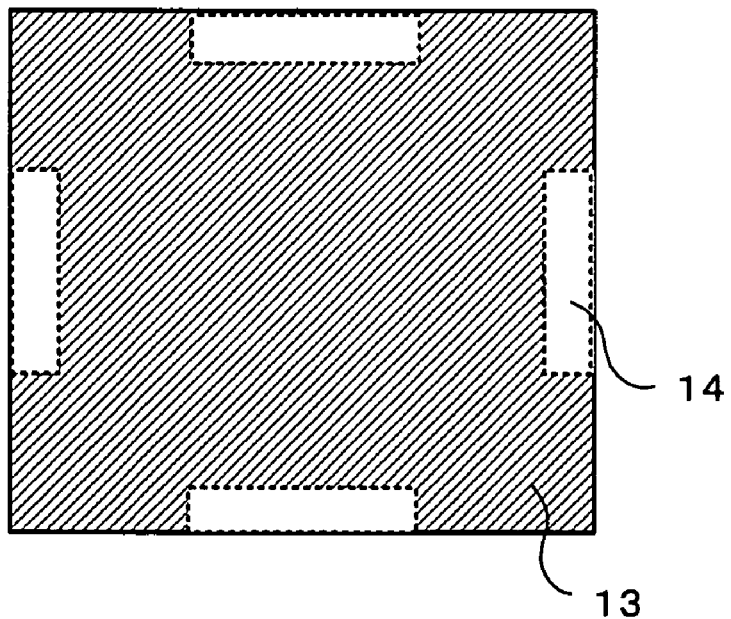
FIG. 7 illustrates schematic views of an integrated circuit chip with the supporting member of the pattern, shown in FIG. 6, manufactured by the semiconductor device manufacturing method of the first embodiment.
Figure 7B:
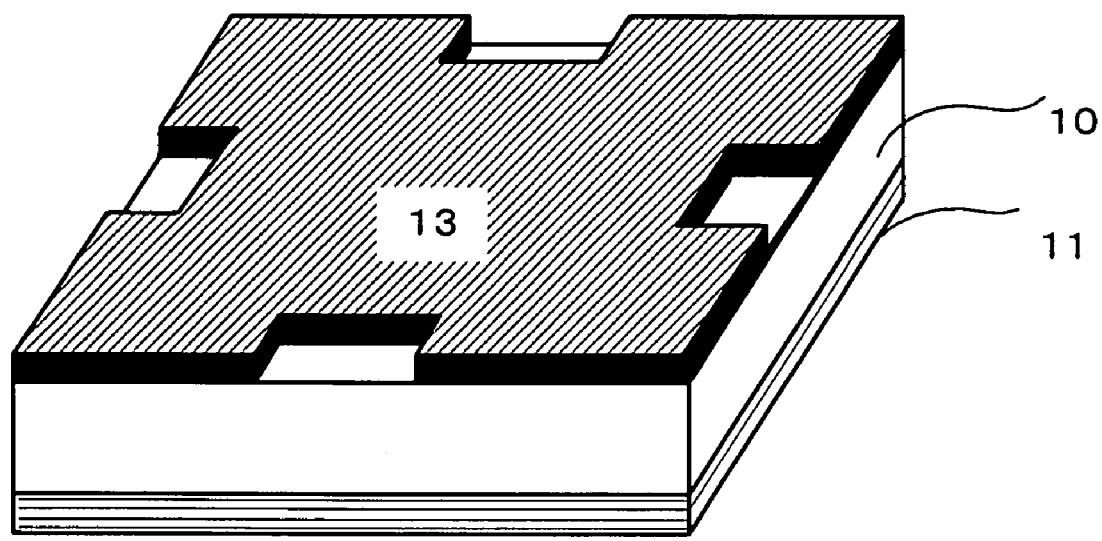

Similar to FIG. 5, FIGS. 7A and 7B are a schematic top view and a schematic perspective view respectively, where the regions to be thinned are the void regions. In particular, the void regions are provided at a part of the outer peripheral region of each supporting block region of the supporting member 13 excluding the corner regions, like those shown in FIG. 6B. As apparent from FIG. 7, a resultant integrated circuit chip has the void region of the supporting member 13 allocated along its four sides but not at its corners and allows its supporting member 13 to be smaller in the area size than the semiconductor substrate 10.

Figure 8A:
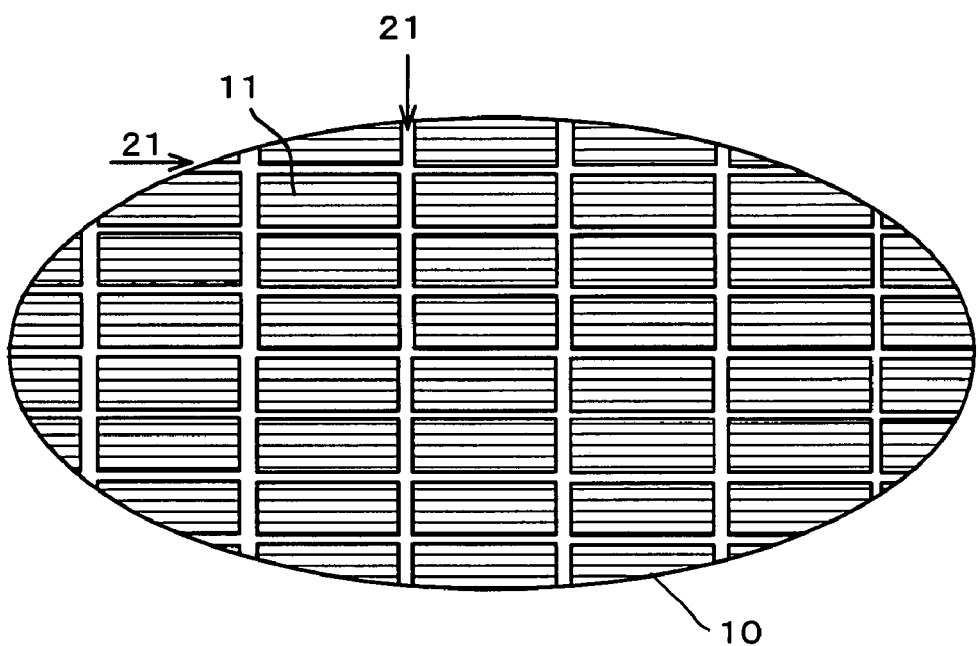
FIG. 8 illustrates a further design pattern of the supporting member.
Figure 8B:
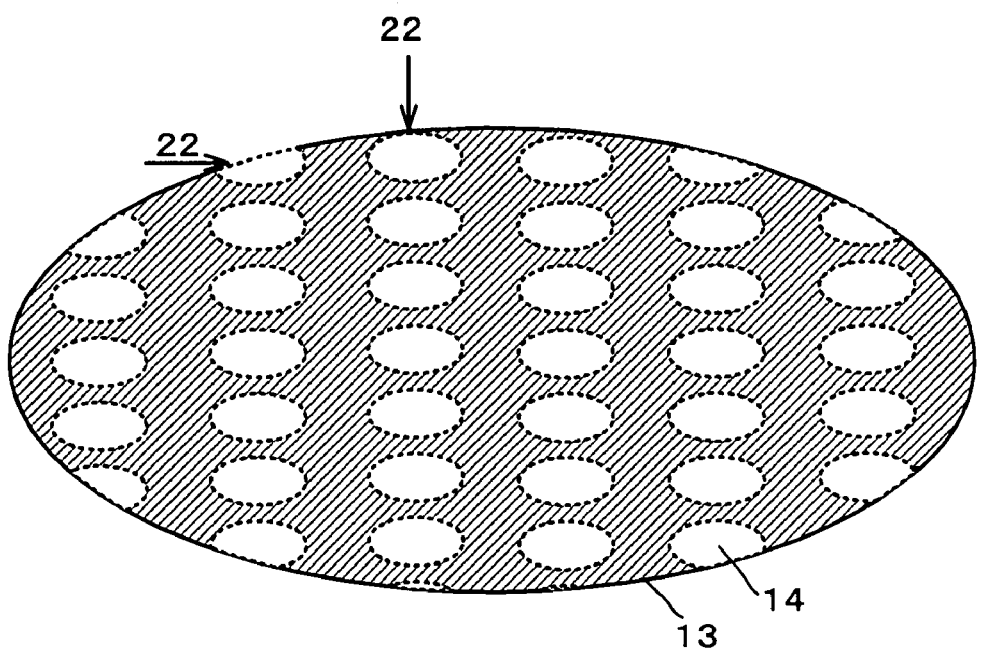
Figure 9A:
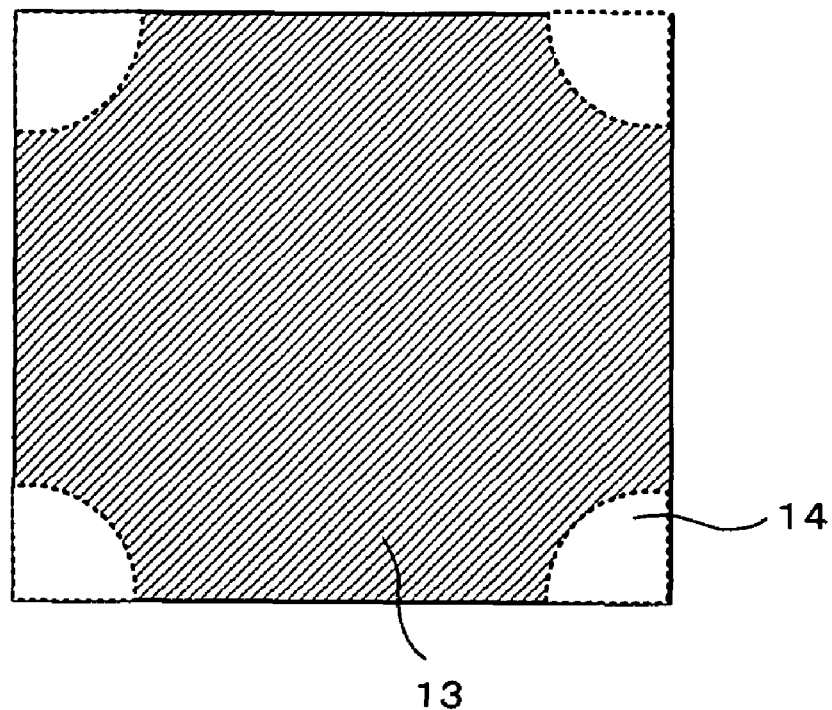
FIG. 9 illustrates schematic views of an integrated circuit chip with the supporting member of the pattern, shown in FIG. 8, manufactured by the semiconductor device manufacturing method of the first embodiment.
Figure 9B:
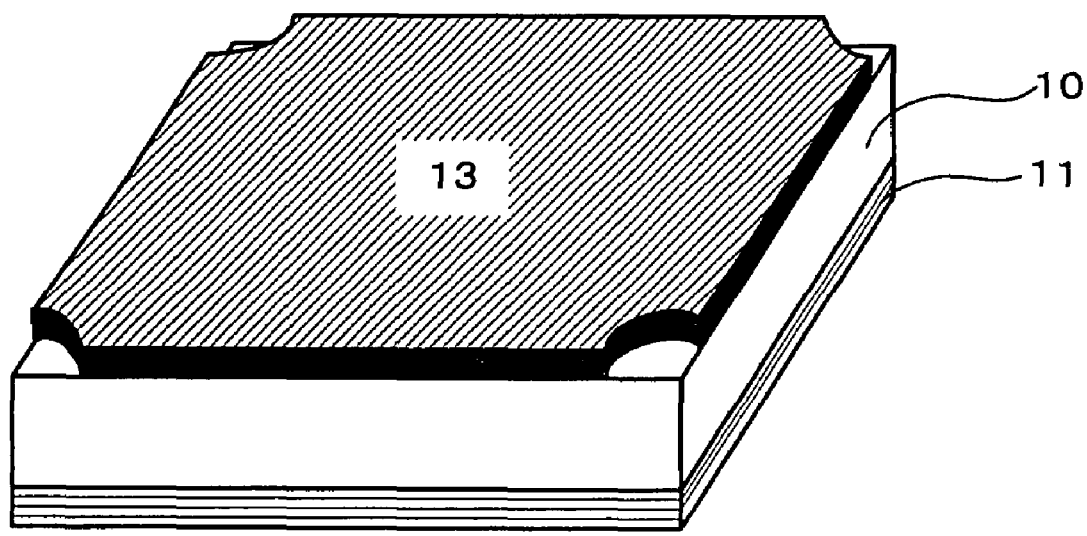

A supporting member 13 shown in FIG. 8B is similar in the design pattern to that shown in FIG. 3B in which the thinned or void regions 14 are provided at all the four corners of the outer peripheral region of each supporting block region but different in the shape of the thinned or void regions. More specifically, while the thinned or void regions 14 at the corners in the design pattern shown in FIG. 3B are arranged of an L shape, they are arranged of a circular or oval shape in the design pattern shown in FIG. 8B. FIG. 9 illustrates schematic views of an integrated circuit chip manufactured using the supporting member 13 of this design pattern by the foregoing steps. Similar to FIG. 5, FIGS. 9A and 9B are a schematic top view and a schematic perspective view respectively, where the regions to be thinned are the void regions. The void regions 14 are provided at the four corners of the outer peripheral region of each supporting block region of the supporting member 13, as shown in FIG. 8B. As apparent from FIG. 9, a resultant integrated circuit chip has the void regions of the supporting member 13 allocated at its corners and allows its supporting member 13 to be smaller in the area size than the semiconductor substrate 10.

Figure 10A:
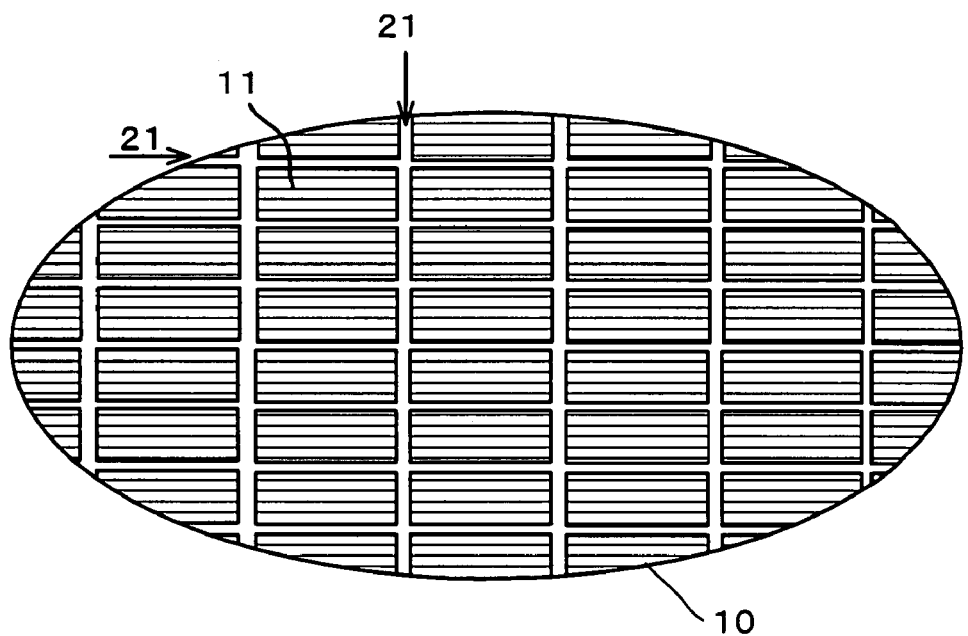
FIG. 10 illustrates a still further design pattern of the supporting member.
Figure 10B:
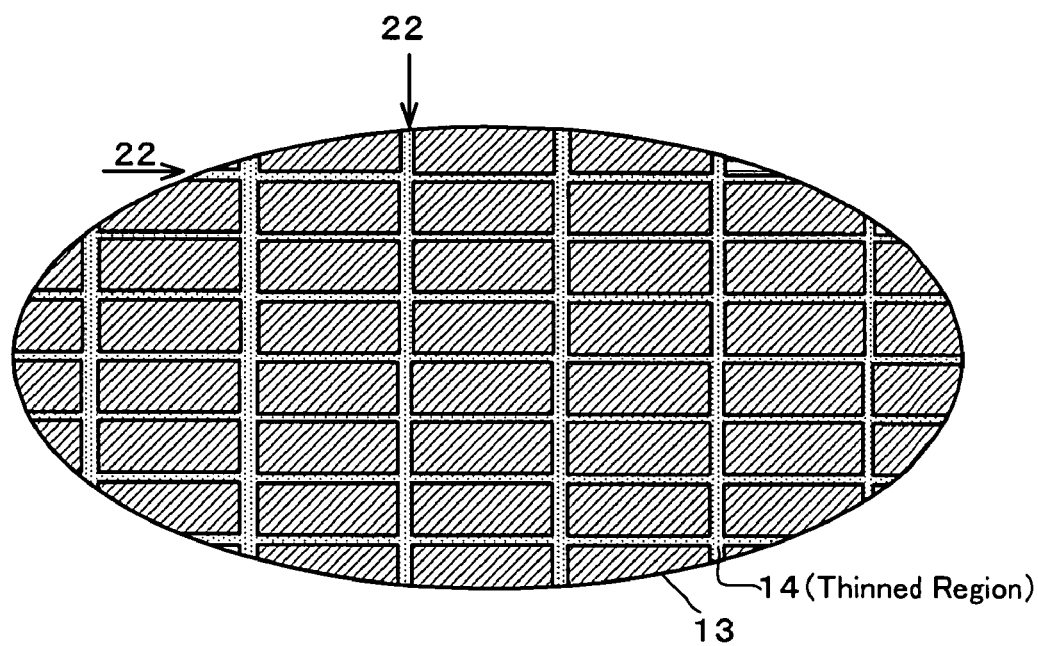
Figure 11A:
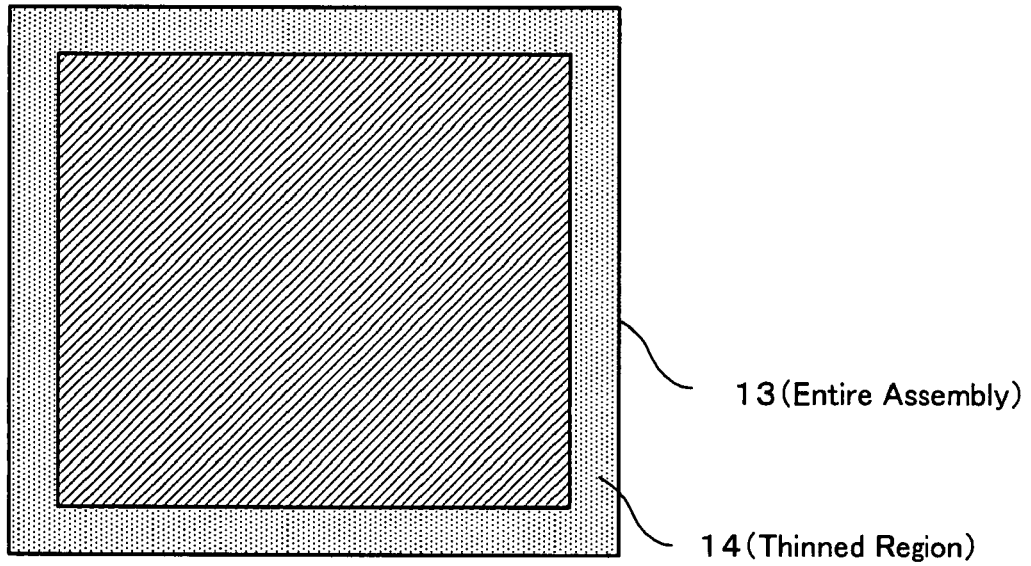
FIG. 11 illustrates schematic views of an integrated circuit chip with the supporting member of the pattern, shown in FIG. 10, manufactured by the semiconductor device manufacturing method of the first embodiment.
Figure 11B:
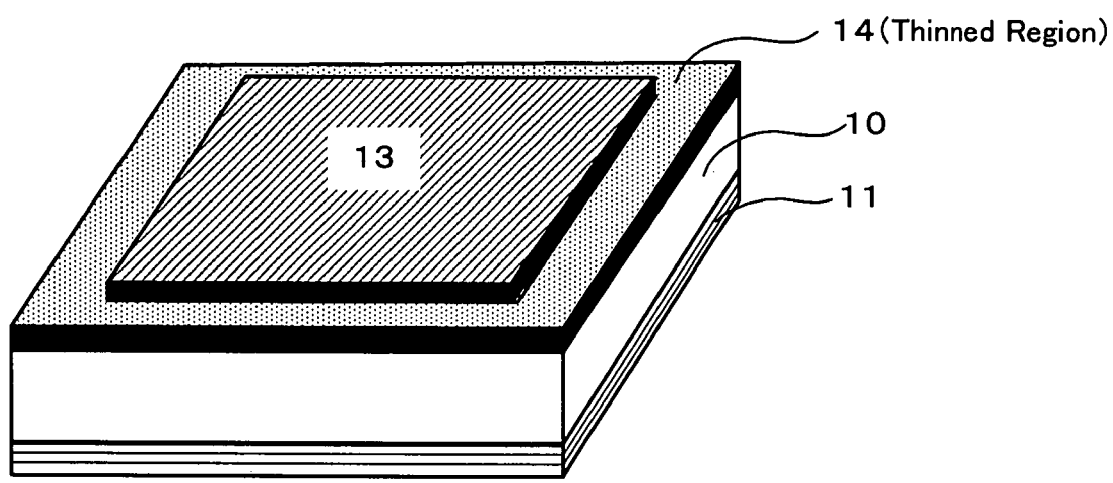

A supporting member 13 shown in FIG. 10B is arranged in which the thinned regions 14 are provided extending along all the outer peripheral region of each supporting block region as positioned correspondingly beneath the scribing lines 21. FIG. 11 illustrates schematic views of an integrated circuit chip manufactured using the supporting member 13 of this design pattern by the foregoing steps. FIG. 11A is a schematic top view and FIG. 11B is a schematic perspective view. As apparent from FIG. 10B, the thinned regions 14 extend along all the outer peripheral region of each supporting block region on the supporting member 13 and a resultant integrated circuit chip shown in FIG. 11 has the supporting member 13 thinned along the outer peripheral region thereof.

Figure 12A:
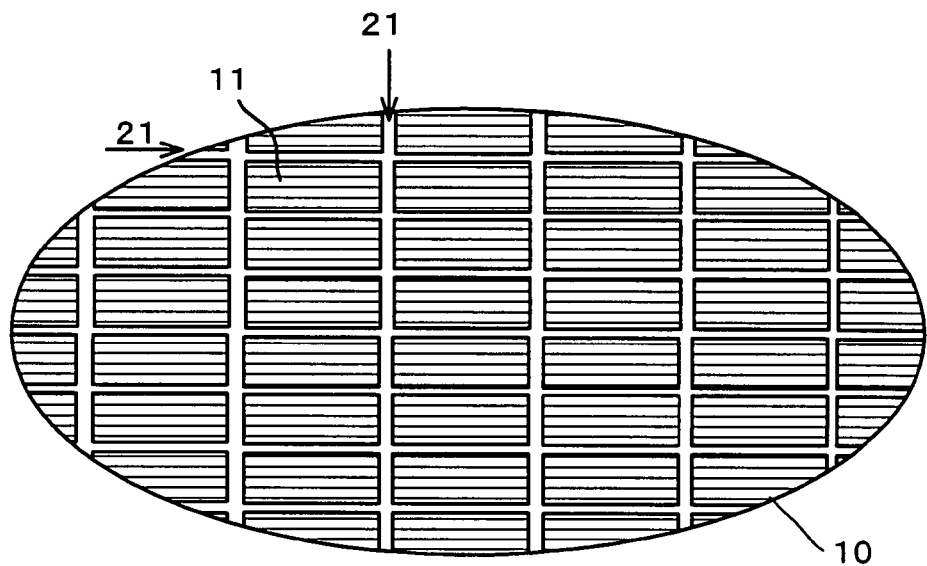
FIG. 12 illustrates still further design patterns of the supporting member.
Figure 12B:
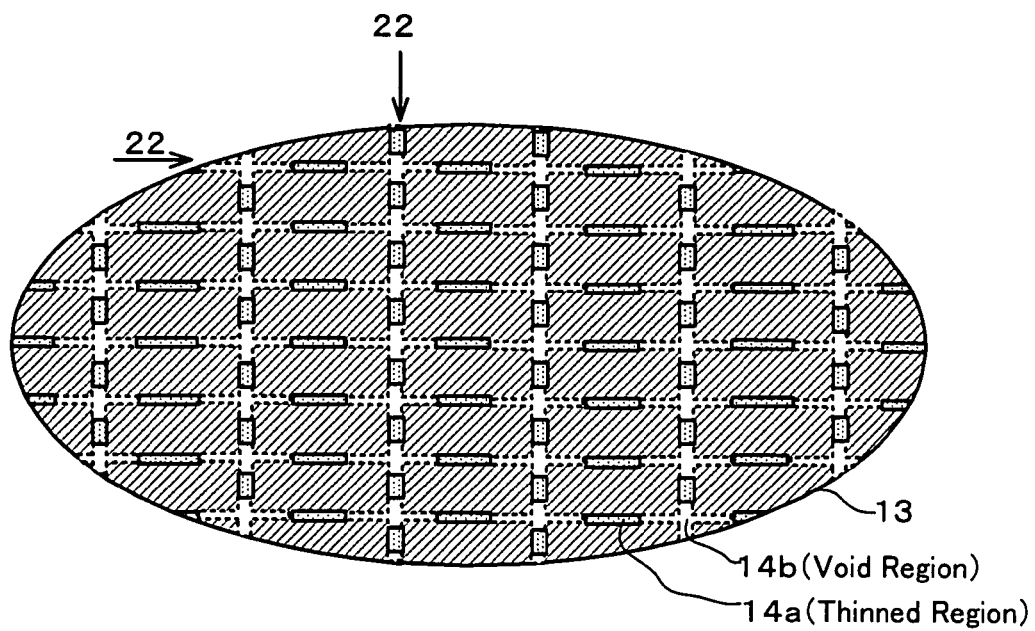
Figure 13A:
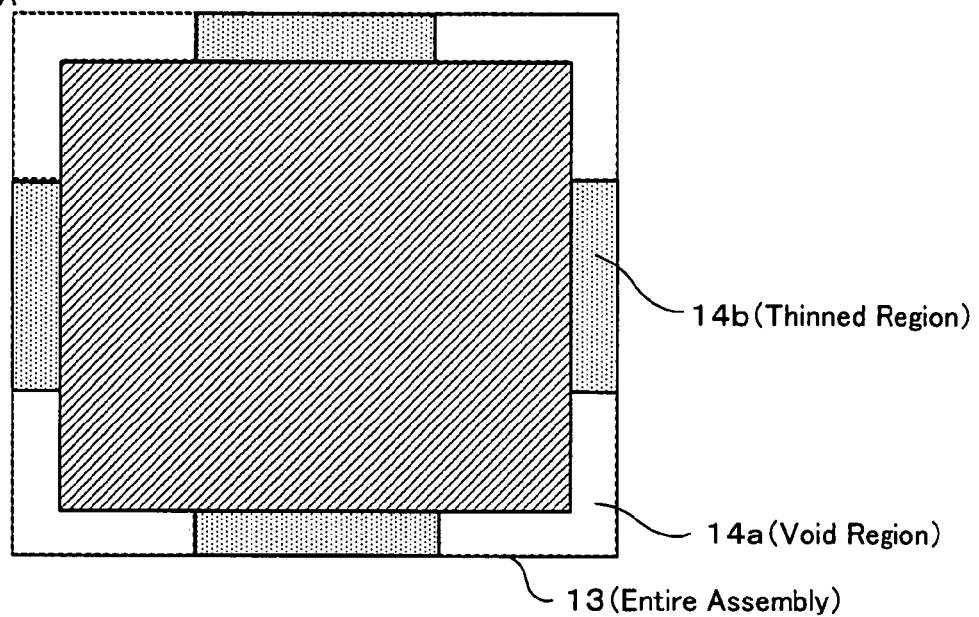
FIG. 13 illustrates schematic views of an integrated circuit chip with the supporting member of the pattern, shown in FIG. 12, manufactured by the semiconductor device manufacturing method of the first embodiment.
Figure 13B:
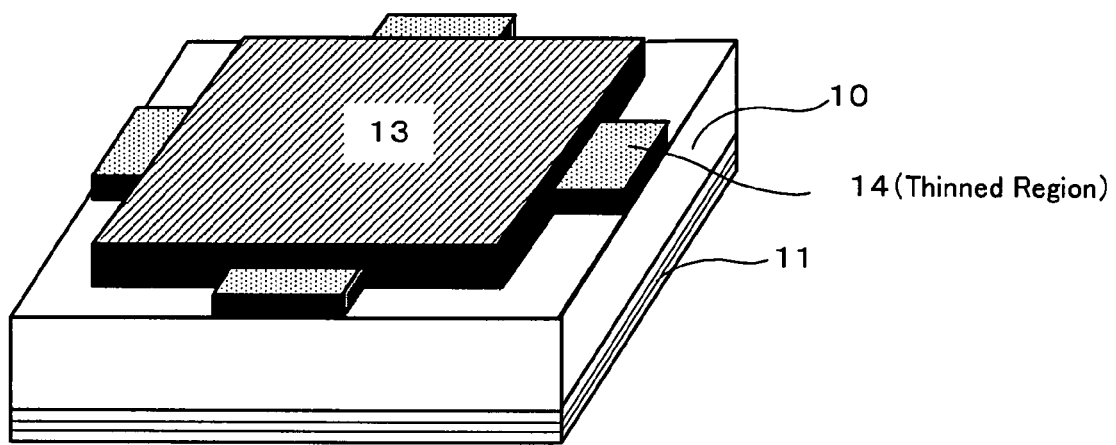

A supporting member 13 shown in FIG. 12B carries a combination of the design pattern shown in FIG. 3B and the design pattern shown in FIG. 6B, in which the void regions 14b are provided at all the four corners of the outer peripheral region of each supporting block region while the thinned regions 14a are provided partially along the outer peripheral region, other than the corners, of the same supporting block region. FIG. 13 illustrates schematic views of an integrated circuit chip manufactured using the supporting member 13 of this design pattern by the foregoing steps. FIG. 13A is a schematic top view and FIG. 13B is a schematic perspective view. The void regions 14b are provided at the four corners of the outer peripheral region of each supporting block region of the supporting member 13, as shown in FIG. 12B. As apparent from FIG. 13, a resultant integrated circuit chip has the void regions 14b of the supporting member 13 allocated at its corners while the thinned regions 14a allocated partially along the outer peripheral region and thus allows its supporting member 13 to be thinned along partially the outer peripheral region other than the corners.

Although the design pattern shown in FIG. 12 carries the void regions 14b provided at the four corners of the outer peripheral region of each supporting block region and the thinned regions 14a provided partially along the outer peripheral region, other than the corners, of the same, the void region 14b and the thinned region 14a may be replaced at the positional relationship by each other. While either the thinned region 14a or the void region 14b is provided partially along the outer peripheral region of the supporting block region on the supporting member 13 in the design pattern shown in FIG. 12, it may be replaced by a region with normal thickness (of which the thickness is equal in the thickness at the center of the supporting block region of the supporting member 13).

The design patterns shown in FIGS. 3, 6, 8, 10, and 12 are illustrative but not of limitations.

Second Embodiment

The second embodiment (referred to as "this embodiment" hereinafter) will be described referring to FIGS. 14 and 15. FIG. 14 is a schematic cross sectional view of steps, FIG. 14A to FIG. 14F, for manufacturing a semiconductor device of this embodiment. FIG. 15 is a flowchart showing the steps of FIG. 14 and the following description will be made using the steps numbered in FIG. 15.

This embodiment is different in the order of the steps from the first embodiment. Like components are denoted by like numerals as those in the first embodiment, for example, the supporting member 13, and will be described in no more detail.

Figure 14A:
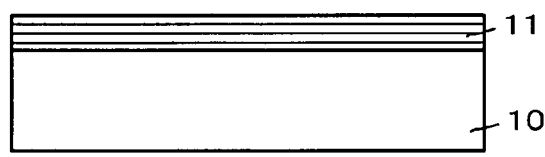
FIG. 14 is a schematic cross sectional view showing the steps of a semiconductor device manufacturing method of a second embodiment.
Figure 15:
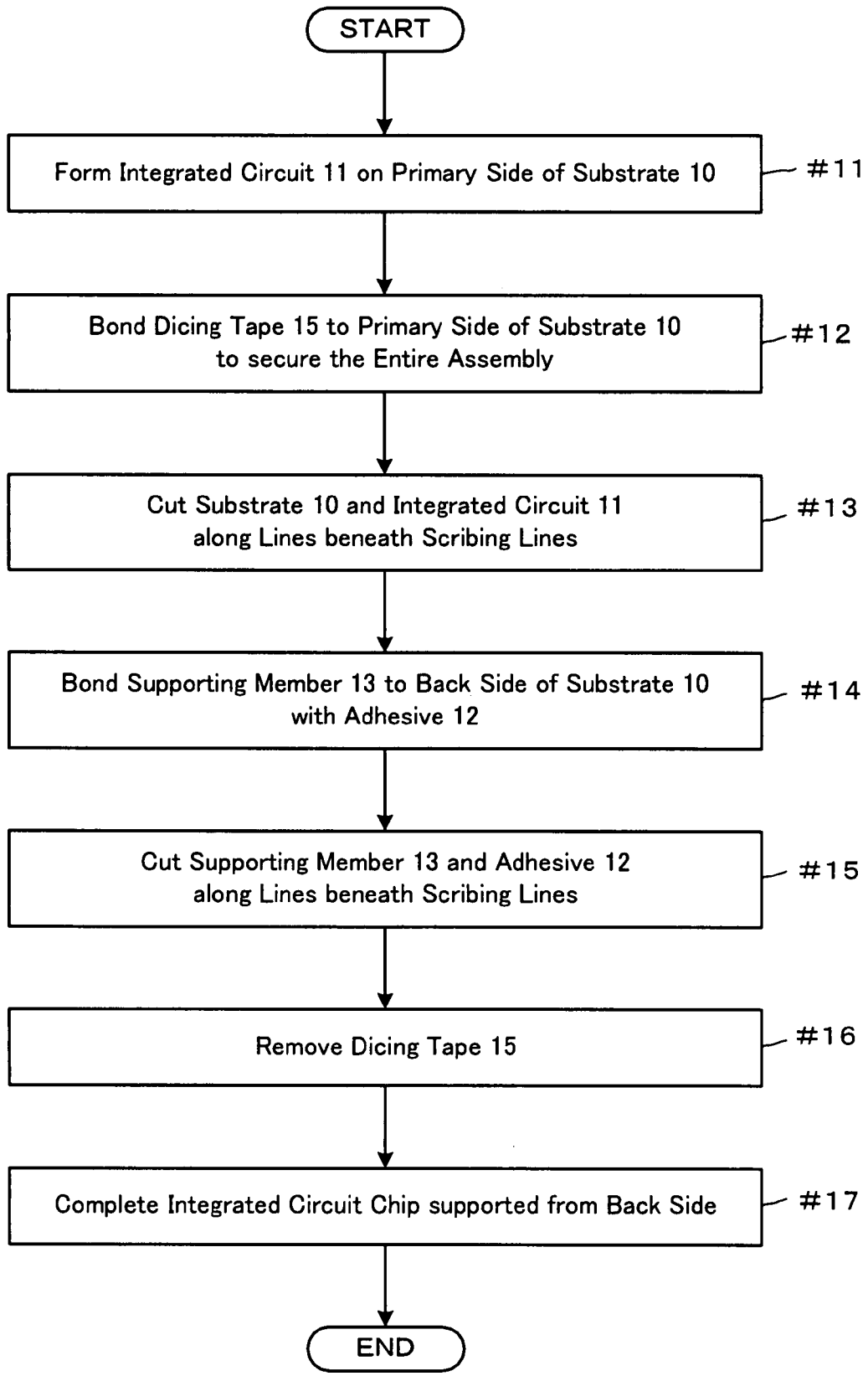
FIG. 15 is a flowchart showing the steps of the semiconductor device manufacturing method of the second embodiment.

As shown in FIG. 14A, the flowchart starts with providing two or more integrated circuits 11 on the primary side of a semiconductor substrate 10 made of a silicon material or the like (Step #11), similar to Step #1 of the first embodiment. Then, the semiconductor substrate 10 is thinned by, for example, polishing its back side.

Figure 14B:
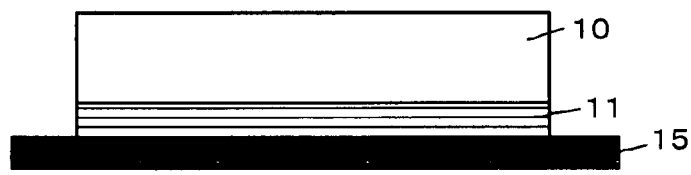

This is followed by, as shown in FIG. 14B, attaching a dicing tape 15 to the primary side of the semiconductor substrate 10 where the integral circuits 11 are arrayed to secure the entire assembly at stableness (Step #12).

Figure 14C:
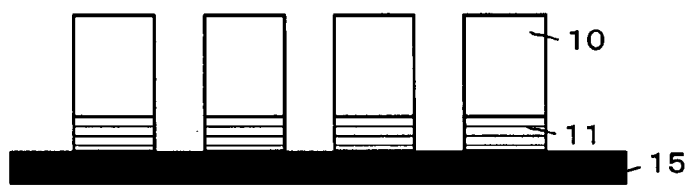

As shown in FIG. 14C, the integrated circuits 11 and the semiconductor substrate 10 are cut (diced) at once along the cutting lines corresponding to the scribing lines between the integrated circuits 11, using a diamond blade or the like (Step #13).

Figure 14D:
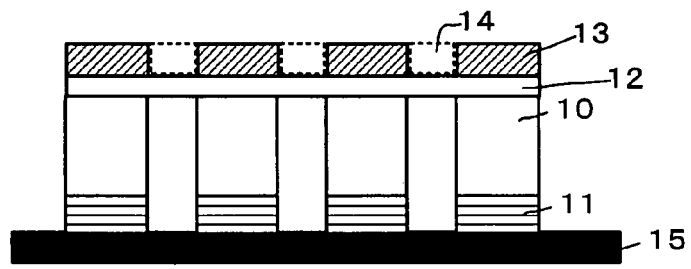

Then, as shown in FIG. 14D, the supporting member 13 carrying a pattern of the void or thinned regions 14 is bonded by an adhesive 12 to the back side of the semiconductor substrate 10 (Step #14). The adhesive 12 and the material and construction of the supporting member 13 are identical to those of the first embodiment.

Figure 14E:
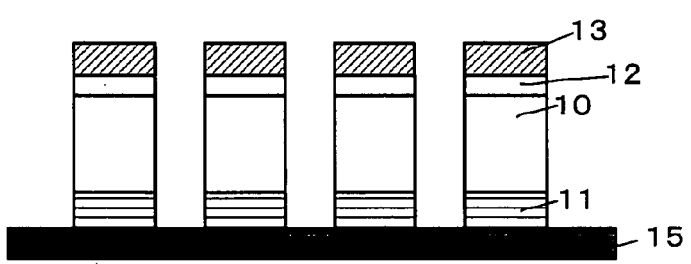

As shown in FIG. 14E, the supporting member 13 and the adhesive 12 is cut apart along the cutting lines positioned correspondingly beneath the scribing lines between the integrated circuits 11 (Step #15).

Figure 14F:
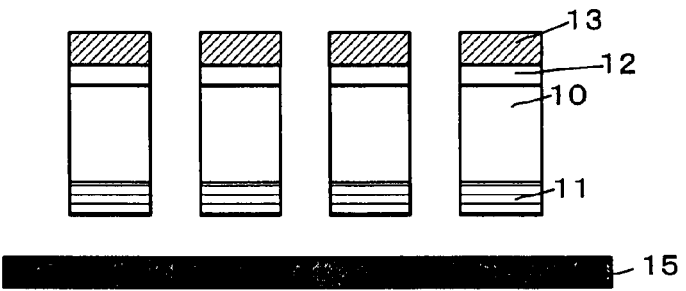

As shown in FIG. 14F, the dicing tape 15 is removed from each integrated circuit chip joined at the back side to the supporting member 13 (Step #16). As the result, the integrated circuit chip remains supported at the back side with the supporting member 13 (Step #17). When its back side has been joined directly with the semiconductor supporting member 13, the integrated circuit chip is subjected to a known flip chip technique for the surface mounting. After the post steps including an inspection step, the semiconductor device of this embodiment will be finished.

The semiconductor device of this embodiment manufactured by the above described steps, like that of the first embodiment, at the cutting step of Step #15, allows the particular regions of the supporting member 13 including the cutting lines are included at least locally in the regions to be thinned, they remain open as voids or their thickness is smaller than that of the supporting block regions. Therefore, the force required for cutting the supporting member can be lower than that for cutting a conventional supporting member with uniform thickness. Also, as the supporting member 13 to be cut apart is minimized in the area at the cross section subjected to the cutting, it can create a less amount of the burrs than the conventional supporting member.

Third Embodiment

The third embodiment (referred to as "this embodiment" hereinafter) will be described referring to FIGS. 16 to 19. FIG. 16 is a schematic cross sectional view of steps, FIG. 16A to FIG. 16E, for manufacturing a semiconductor device of this embodiment. FIG. 17 is a flowchart showing the steps of FIG. 16 and the following description will be made using the steps numbered in FIG. 17. FIG. 18 illustrates a design pattern of the supporting member 13 in this embodiment. FIG. 19 is a schematic view of an integrated circuit chip manufactured by the steps of this embodiment, using the supporting member 13 of the design pattern shown in FIG. 18.

This embodiment is different in the order of the steps from the first and second embodiments. The supporting member 13 bonded to the semiconductor substrate 10 in either the first or second embodiment remains a plate material before subjected to the cutting step although having a pattern of the void or thinned regions 14. In this embodiment, the supporting member is separated into the supporting block regions before subjected to the step of bonding to the semiconductor substrate 10. Like components are denoted by like numerals as those in the first and second embodiments and will be described in no more detail.

Figure 16A:
FIG. 16 is a schematic cross sectional view showing the steps of a semiconductor device manufacturing method of a third embodiment.
Figure 17:
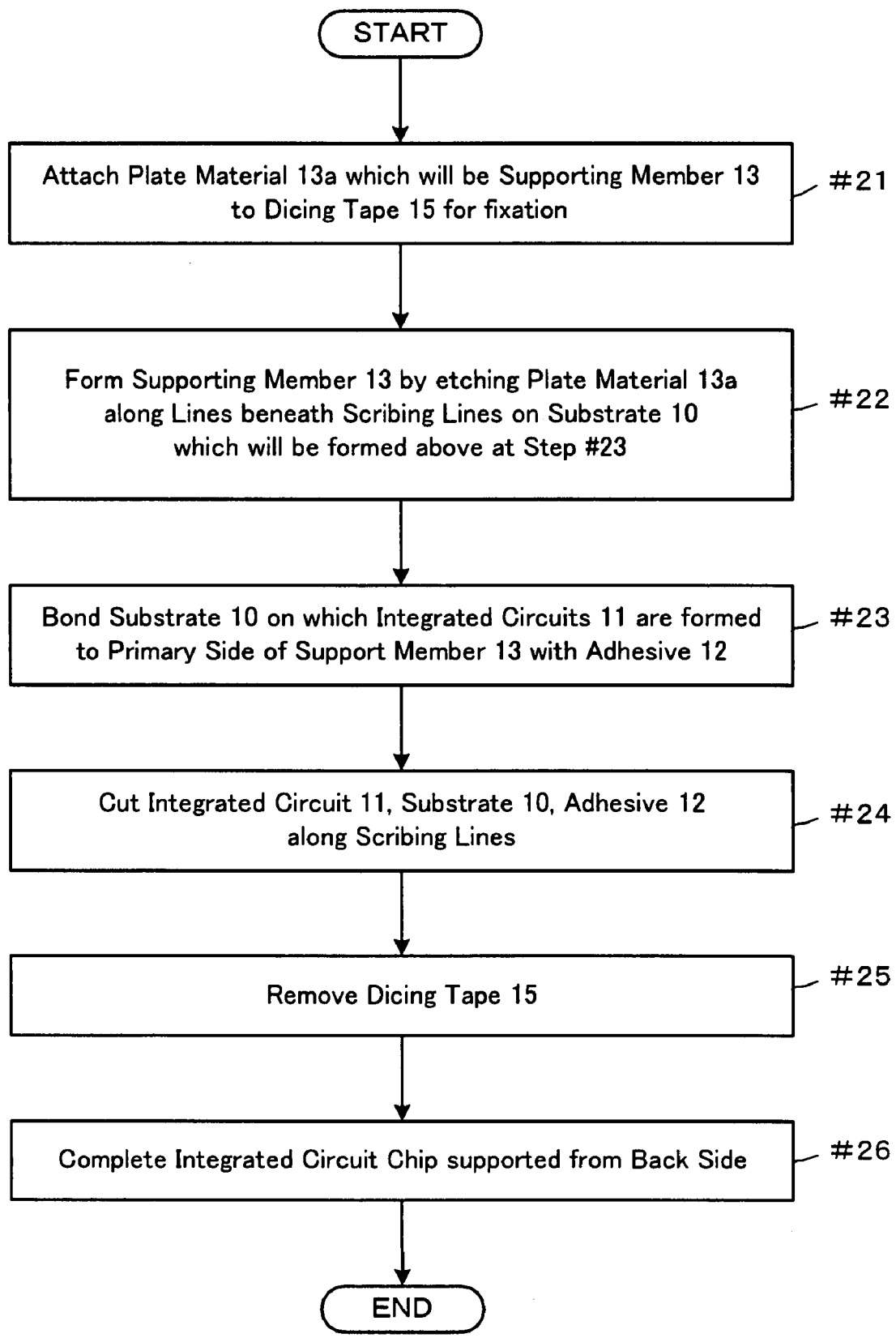
FIG. 17 is a flowchart showing the steps of the semiconductor device manufacturing method of the third embodiment.

As shown in FIG. 16A, the flowchart starts with attaching a dicing tape 15 to a plate material 13a which becomes the supporting member 13 later to secure their assembly at stableness (Step #21).

Figure 16B:

Then as shown in FIG. 16B, the plate material 13a is subjected to photo-lithography and etching actions for separation along the cutting lines positioned correspondingly beneath the scribing lines between the integrated circuits 11 on the primary side of the semiconductor substrate 10 to which the supporting member 13 is bonded at the later step (Step #22). As the result, the plate material 13a is cut into the supporting block regions which turn to the supporting members 13, each having the void regions 14 at the entire outer peripheral region. Since the supporting members 13 are attached with the dicing tape 15, they are not separated but remain in an array. Although the supporting members remain attached to, but is not limited to, the dicing tape 15 in this embodiment for avoiding the dropping off, they may be held together by any applicable technique.

Figure 16C:
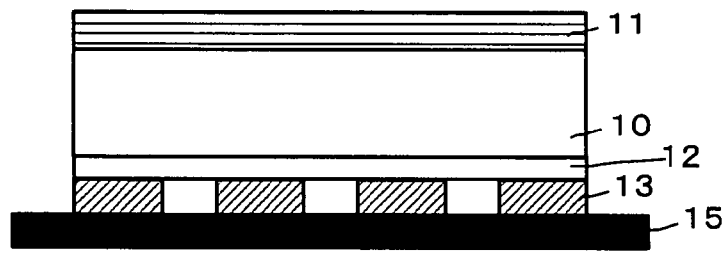

This is followed by, as shown in FIG. 16C, bonding the supporting members 13 by an adhesive 12 to the back side of the semiconductor substrate 10 on which the integrated circuits 11 are arrayed on the primary side (Step #23). Particularly before being bonded to the semiconductor substrate 10, the supporting members 13 of the supporting block regions are aligned with the back side of the integrated circuit chips of which the positions are defined by the scribing lines extending between the integrated circuits 11.

Figure 16D:
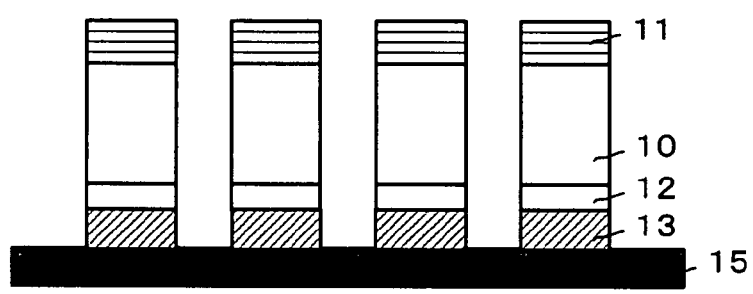

Then as shown in FIG. 16D, the integrated circuits 11 and the semiconductor substrate 10 bonded together by the adhesive 12 are cut at once along the scribing lines between the integrated circuits 11, using a diamond blade or the like (Step #24).

Figure 16E:
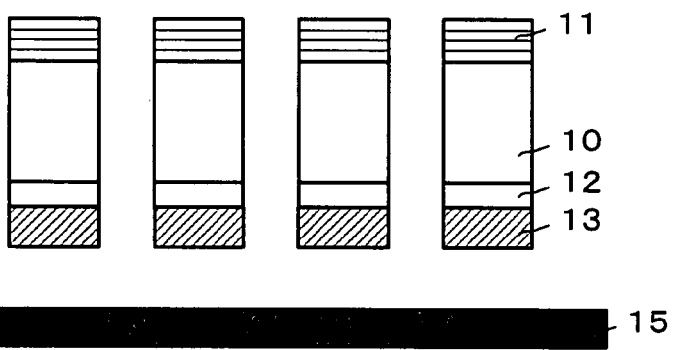

As shown in FIG. 16E, the dicing tape 15 is removed from an array of the integrated circuit chips bonded at the back side with the supporting members 13 (Step #25). The integrated circuit chip is hence separated as remaining supported at the back side with the supporting member 13 (Step #26). When its back side has been joined directly with the supporting member 13, the integrated circuit chip is subjected to a known flip chip technique for the surface mounting. After the post steps including an inspection step, the semiconductor device of this embodiment will be finished.

Figure 18A:
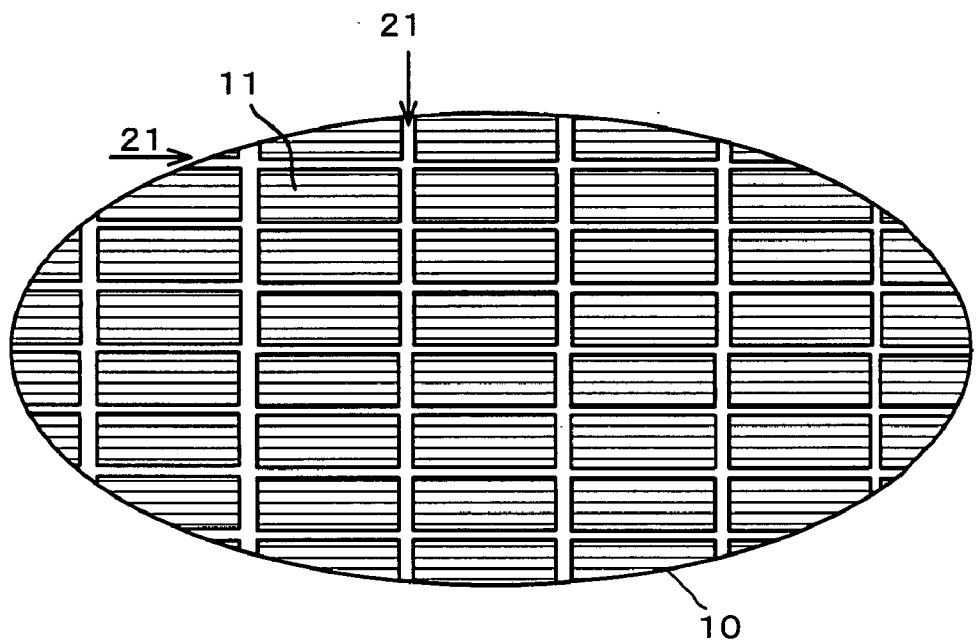
FIG. 18 illustrates a design pattern of the supporting member in the semiconductor device manufacturing method of the third embodiment.
Figure 18B:
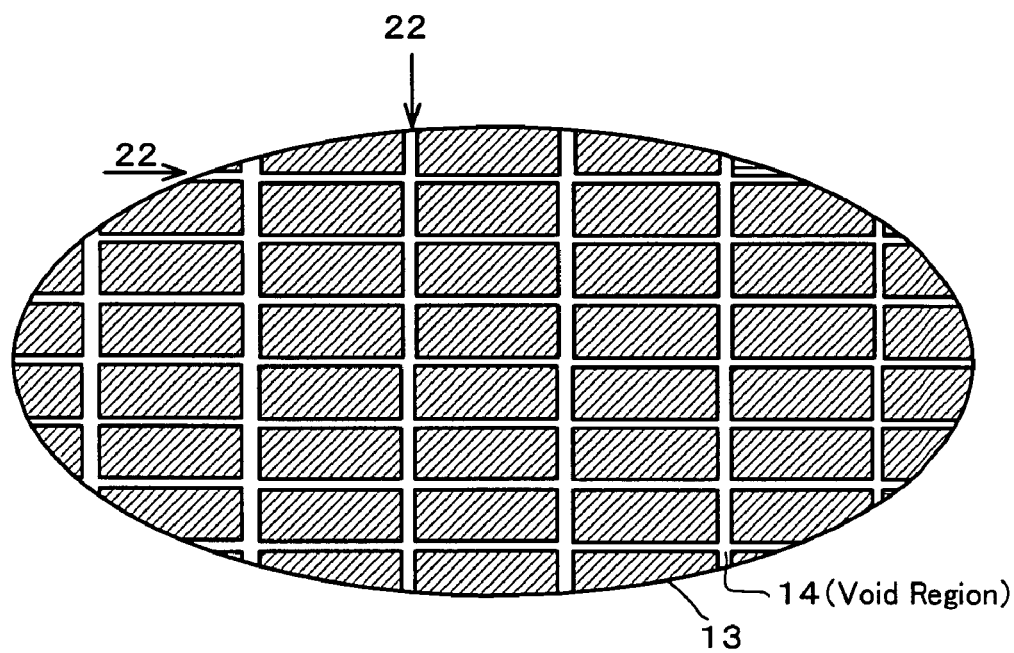

FIG. 18 illustrates a design pattern of the supporting members 13 in this embodiment together with the semiconductor substrate 10 on which the primary side the integrated circuits 11 are arrayed. FIG. 18A is a schematic view at perspective elevation of the semiconductor substrate 10 on which the integrated circuits 11 are arrayed and FIG. 18B is a schematic view at perspective elevation of the corresponding pattern of the supporting members 13. In this embodiment, the part located correspondingly beneath the scribing lines 21 are removed from the plate material 13a by etching to form the supporting members 13 at Step #22, and the supporting members 13 remain attached to the dicing tape 15 for avoiding them from being dropped off. More particularly, each of the supporting members 13 has the void region 14 at all the outer peripheral region of the supporting block region.

Figure 19A:
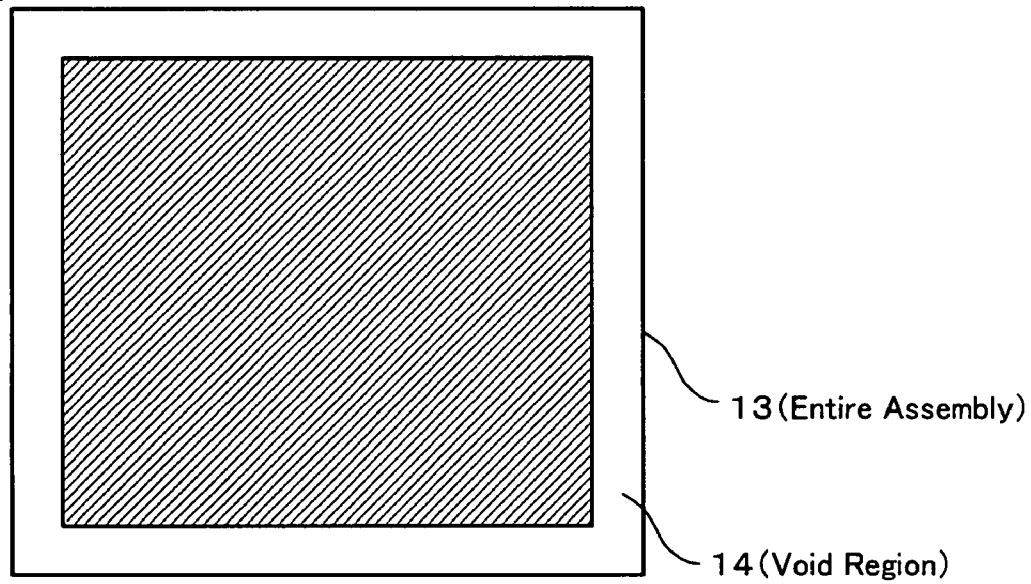
FIG. 19 is a schematic view of an integrated circuit chip with the supporting member of the pattern, shown in FIG. 18, manufactured by the semiconductor device manufacturing method of the third embodiment.
Figure 19B:
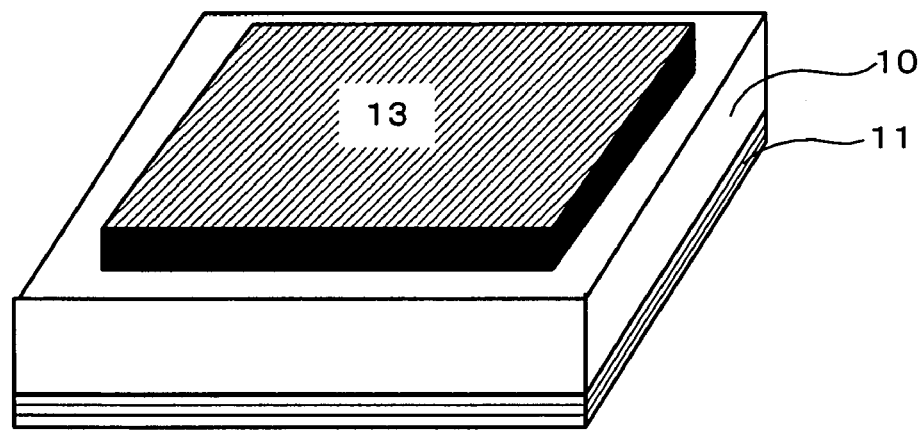

FIG. 19 illustrates schematic views of an integrated circuit chip manufactured using the supporting member 13 of the design pattern shown in FIG. 18. FIG. 19A is a schematic top view and FIG. 19B is a schematic perspective view. The void regions 14 are provided at all the outer peripheral region of each supporting block region of the supporting member 13, as shown in FIG. 18B. As apparent from FIG. 19, a resultant integrated circuit chip does not have the supporting member 13 at its outer peripheral region.

The semiconductor device of this embodiment is manufactured by the above described steps where the plate material which will become the supporting members 13 is attached with the dicing tape and separated by etching into the supporting block regions corresponding to their respective integral circuit chips and then the semiconductor substrate on which the integrated circuit is disposed is joined with each of the supporting members. Accordingly, the generation of burrs can be minimized as the step of cutting the full size of the supporting member is eliminated.

The etching step at Step #22 in this embodiment is adapted for removing the cutting regions of the plate material 13a positioned correspondingly beneath the scribing lines between the integrated circuits 11 to separate the plate material 13a into the supporting block regions, to form the supporting member 13 of which each supporting block region has the void region 14 at all the outer peripheral region. Alternatively, the cutting regions of the strips 13a corresponding the scribing lines between the integrated circuits 11 are etched to a depth to develop the thinned regions without completely separating the supporting block regions. In the latter case, the supporting member 13 is identical in the construction to that shown in FIG. 10B where the supporting member 13 has the thinned regions 14 at all the outer peripheral region of each supporting block region.

More specifically, this can be done by bonding the substrate 10 to the primary side of the supporting member 13 at Step #23 and then cutting the assembly of the integrated circuit 11, the substrate 10, the adhesive 12, and the supporting member 13 at once along the scribing lines at Step #24. Accordingly, a resultant integrated circuit chip is provided as remaining supported at the back side with the supporting member 13. This is different from the procedure of the third embodiment and requires an extra step of cutting the supporting member 13. However, as the supporting member 13 to be cut apart has been thinned along the cutting lines, like that of the first or second embodiment, the force required for cutting the supporting member can be lower than that for cutting a conventional supporting member with uniform thickness. Also, as the supporting member 13 to be cut apart is minimized in the area at the cross section subjected to the cutting, it can create a less amount of the burrs than the conventional supporting member.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A semiconductor device manufacturing method having a step of cutting a semiconductor substrate, on a primary side of which a plurality of integrated circuits are arrayed, along scribing lines extending lengthwise and widthwise on the semiconductor substrate to separate the semiconductor substrate into integrated circuit chips, the semiconductor device manufacturing method comprising:
    forming the plurality of integrated circuits on the primary side of the semiconductor substrate;
    attaching a dicing tape to the primary side of the semiconductor substrate to secure the semiconductor substrate after the forming step;
    cutting the semiconductor substrate along the scribing lines from the back side to form the integrated circuit chips after the attaching step
    bonding a supporting member to a back side of the semiconductor substrate which is opposite to the primary side after the step of cutting the semiconductor substrate has been performed; and
    cutting the supporting member along the scribing lines from the back side to separate the semiconductor substrate into a plurality of supported integrated circuit chips, wherein the supporting member has a supporting block region located beneath each of the integrated circuit chips, a thinned region which is thinner than the supporting block regions and a void region which is an opening in the supporting member in at least a part of an outer peripheral region of each of the supporting block regions, the outer peripheral region located beneath the scribing lines and then removing the supported integrated circuit chips from the dicing tape after the cutting step.

2. The semiconductor device manufacturing method according to claim 1, wherein the supporting member has void regions at each corner of the outer peripheral region of the supporting block regions and thinned regions at side edges of the supporting block regions.

3. The semiconductor device manufacturing method according to claim 1, wherein the supporting member has void regions at the side edges of the supporting block regions, and thinned regions at each corner of the outer peripheral regions of the supporting block regions.

4. A method of manufacturing semiconductor devices from a semiconductor substrate having a plurality of integrated circuits formed in a primary side thereof, comprising:
    bonding a first side of a supporting member to a side of the semiconductor substrate that is opposite the primary side, wherein the supporting member has supporting block regions located at positions that correspond to positions of the integrated circuits, and wherein voids are formed through the supporting member at side edges of the supporting block regions, but not at corners of the supporting block regions; and
    cutting the semiconductor substrate and the supporting member along scribing lines that are located between the integrated circuits and between the supporting block regions to separate the semiconductor substrate into a plurality of supported semiconductor devices.

5. The method of claim 4, further comprising:
    attaching a dicing tape to a second side of the supporting member opposite the first side before conducting the cutting step; and
    removing the supported semiconductor devices from the dicing tape after performing the cutting step.

6. The method of claim 4, wherein the supporting member that is attached to the semiconductor substrate has thinned regions located along the peripheral edges of the supporting block regions.

7. The method of claim 6, wherein the thinned regions are located at corners of the supporting block regions.

8. The method of claim 6, wherein the thinned regions are located along side edges of the supporting block regions.

9. The method of claim 4, further comprising:
    attaching a supporting substrate that does not have any voids to a dicing tape;
    forming voids through the supporting substrate at locations corresponding to side edges of the supporting block regions to form the supporting member, and
    removing the dicing tape after the cutting step has been performed.

10. The method of claim 9, further comprising forming thinned regions in the supporting substrate at locations corresponding to peripheral edges of the supporting block regions.

11. A method of manufacturing semiconductor devices from a semiconductor substrate having a plurality of integrated circuits formed in a primary side thereof, comprising:
    attaching a dicing tape to a first side of a supporting substrate that does not have any thinned regions or voids;
    forming voids along peripheral edges of supporting block regions in the supporting substrate so that only the supporting block regions themselves remain after the forming step, wherein the supporting block regions are located at positions that correspond to the integrated circuits of the semiconductor substrate, to thereby form a supporting member;
    attaching a second side of the supporting member opposite the first side to a semiconductor substrate having a plurality of integrated circuits formed in a primary surface thereof, wherein the supporting member is attached to a surface of the semiconductor substrate opposite to the primary side;
    cutting at least one of the semiconductor substrate and the supporting member along scribing lines that are located between the integrated circuits formed in the semiconductor substrate to form a plurality of supported semiconductor devices; and
    removing the supported semiconductor devices from the dicing tape.

12. A semiconductor device manufacturing method having a step of cutting a semiconductor substrate, on a primary side of which a plurality of integrated circuits are arrayed, along scribing lines extending lengthwise and widthwise on the semiconductor substrate to separate the semiconductor substrate into integrated circuit chips, the semiconductor device manufacturing method comprising:

attaching a dicing tape to the back side of a plate of material which will become a supporting member and on which neither thinned regions nor voids have been formed;

etching a part of the plate of material to develop void regions and thinned regions in the plate of material, to thereby form the supporting member, after the attaching step is performed;

bonding a primary side of the supporting member to a back side of the semiconductor substrate which is opposite to a primary side upon which the integrated circuits are arrayed after the etching step has been performed;

cutting at least one of the supporting member and the semiconductor substrate along the scribing lines to separate the semiconductor substrate into a plurality of supported integrated circuit chips, wherein the supporting member has a supporting block region located beneath each of the integrated circuits of the semiconductor substrate, a thinned region which is thinner than the supporting block regions and a void region which is an opening in the supporting member in at least a part of an outer peripheral region of each of the supporting block regions, the outer peripheral region located beneath the scribing lines; and removing the supported integrated circuit chips from the dicing tape after the cutting step has been performed.

* * * * *